United States Patent
Yeh et al.

(10) Patent No.: US 12,078,921 B2
(45) Date of Patent: Sep. 3, 2024

(54) PHASE-SHIFT RETICLE FOR USE IN PHOTOLITHOGRAPHY

(71) Applicant: ENTEGRIS, INC., Billerica, MA (US)

(72) Inventors: Tse-An Yeh, Taipei (TW); Jun-Fei Zheng, Westport, CT (US); Montray Leavy, Singapore (SG); Chun Kuang Chen, Zhubei (TW)

(73) Assignee: ENTEGRIS, INC., Billerica, MA (US)

( * ) Notice: Subject to any disclaimer, the term of this patent is extended or adjusted under 35 U.S.C. 154(b) by 122 days.

(21) Appl. No.: 17/529,840

(22) Filed: Nov. 18, 2021

(65) Prior Publication Data

US 2022/0163881 A1 May 26, 2022

Related U.S. Application Data

(60) Provisional application No. 63/116,423, filed on Nov. 20, 2020.

(51) Int. Cl.
*G03F 1/32* (2012.01)
*G03F 1/24* (2012.01)
*G03F 7/00* (2006.01)

(52) U.S. Cl.
CPC ............... *G03F 1/32* (2013.01); *G03F 1/24* (2013.01); *G03F 7/70283* (2013.01)

(58) Field of Classification Search
CPC ........... G03F 1/32; G03F 7/70283; G03F 1/24
See application file for complete search history.

(56) References Cited

U.S. PATENT DOCUMENTS

| 5,503,950 | A | 4/1996 | Miyake |
| 6,361,904 | B1 | 3/2002 | Chiu et al. |
| 11,333,966 | B2 * | 5/2022 | Nozawa .................... G03F 1/32 |
| 2001/0009281 | A1 | 7/2001 | Park |
| 2006/0083997 | A1 * | 4/2006 | Lin .......................... G03F 1/38 430/5 |
| 2009/0170011 | A1 | 7/2009 | Ahn |

(Continued)

FOREIGN PATENT DOCUMENTS

| CN | 109581804 A | 4/2019 |
| JP | 2008310090 A | 12/2008 |

(Continued)

OTHER PUBLICATIONS

M.-Claire van Lare, Frank J. Timmermans, Jo Finders, "Alternative reticles for low-k1 EUV imaging," Proc. SPIE 11147, International Conference on Extreme Ultraviolet Lithography 2019, 111470D (Sep. 26, 2019) (Year: 2019).*

(Continued)

*Primary Examiner* — Mark F. Huff
*Assistant Examiner* — Moriah S. Smoot

(57) ABSTRACT

A phase-shift reticle for a photolithography process in semiconductor fabrication is provided. The reticle includes a substrate, a reflective structure, a pattern defining layer and a phase shifter. The reflective structure is disposed over the substrate. The pattern defining layer includes a first material and is deposited over the reflective structure. The pattern defining layer comprises a pattern trench. The phase shifter includes a second material and disposed in the pattern trench. A transmittance of the second material is different from a transmittance of the first material.

19 Claims, 18 Drawing Sheets

(56) References Cited

U.S. PATENT DOCUMENTS

| | | | |
|---|---|---|---|
| 2011/0244378 A1* | 10/2011 | Lin | G03F 1/50 |
| | | | 430/5 |
| 2016/0238924 A1 | 8/2016 | Burkhardt et al. | |
| 2019/0146331 A1* | 5/2019 | Lin | G03F 7/70033 |
| | | | 430/5 |
| 2019/0155138 A1 | 5/2019 | Lee | |
| 2019/0324364 A1* | 10/2019 | Hsu | G03F 1/24 |

FOREIGN PATENT DOCUMENTS

| | | | | |
|---|---|---|---|---|
| JP | 2015008283 A | | 1/2015 | |
| JP | 2018044979 A | | 3/2018 | |
| JP | 2018045016 A | | 3/2018 | |
| JP | 6927177 B2 * | | 8/2021 | G03F 1/20 |
| KR | 20080001475 A * | | 1/2008 | |
| TW | 497165 B | | 8/2002 | |
| TW | 201122720 A | | 7/2011 | |
| WO | 2009136564 A1 | | 11/2009 | |

OTHER PUBLICATIONS

Author: M.-Claire Van Laire, Timmermans, Frank, Jo Finders Title: Low K1 EUV Imaging Proc. of SPIE vol. 11147 111470D-1 2019.

* cited by examiner

PHASE-SHIFT RETICLE FOR USE IN PHOTOLITHOGRAPHY

TECHNICAL FIELD

The disclosure relates generally to a reticle used in a photolithography process, and more specifically to a phase-shift reticle for use in a photolithography process for semiconductor fabrication.

BACKGROUND

One of the process steps commonly encountered in the fabrication of integrated circuits and other semiconductor devices is photolithography. Broadly, photolithography involves selectively exposing a wafer surface to a source of radiation using a patterned template to create an etched surface layer. Typically, the patterned template is a reticle, which is a flat glass plate that contains the patterns to be reproduced on the wafer. For example, the wafer surface may be deposited with a silicon nitride on it, followed by a coating of a light-sensitive liquid polymer or photoresist. Next, an exposure light is reflected off a surface of the reticle to project the desired pattern onto the photoresist-covered wafer.

For a negative photoresist, the portion of the photoresist exposed to the light is chemically modified and remains unaffected when the wafer is subsequently subjected to a chemical media that removes the unexposed photoresist, leaving the modified photoresist on the wafer in the exact shape of the pattern on the reticle. For a positive photoresist, the portion of the photoresist exposed to the light is chemically modified and is removed when the wafer is subsequently subjected to a chemical media, while the unexposed photoresist is left on the wafer. The wafer is then subjected to an etching process that removes the exposed portion of the nitride layer leaving a nitride pattern on the wafer in the exact design of the mask. This etched layer, singly or in combination with other similarly created layers, represents the devices and interconnects between devices characterizing the "circuitry" of a particular integrated circuit or semiconductor chip.

The industry trend is towards the production of chips that are smaller and/or with a higher logic density, necessitating even smaller line widths on larger wafers. However, such developments cause the problem of a small pitch between patterns. Methods that have been explored to form vertical interconnect access (via) holes with small pitches, such as pitches that are smaller than 40 nm, include performing a photolithography process multiple times with the use of two or more reticles each defining patterns of different via holes, which results in an increase of production time and a reduction of throughput capacity.

In addition, the resolution with which the pattern can be reproduced on the wafer surface depends on the wavelength of exposure light used to project the pattern onto the surface of the photoresist-coated wafer. State-of-the-art photolithography tools use extreme ultraviolet (EUV) light with wavelengths of 13.5 nm, which allow minimum feature sizes on the order of 7 nm, 5 nm, or less. Nevertheless, in order to have a higher image contrast of the desired pattern on the photoresist-covered wafer, a higher exposure dose (i.e., higher power output to generate EUV light) is required, which adversely increases the cost of manufacturing semiconductor chips.

SUMMARY

Accordingly, an objective of the present invention is to provide a modified reticle for patterning via holes in a semiconductor chip having relatively small pitches, while using one single reticle and not repeating the photolithography process multiple times. Another objective of the present invention relates to the manufacture of a phase-shift reticle.

In accordance with some embodiments, the reticle includes a substrate, a reflective structure, a pattern defining layer and a phase shifter. The reflective structure is disposed over the substrate. The pattern defining layer includes a first material and is deposited over the reflective structure. The pattern defining layer comprises a pattern trench. The phase shifter includes a second material and disposed in the pattern trench. A transmittance of the second material is different from a transmittance of the first material.

In accordance with some other embodiments, a reticle includes a substrate, a reflective structure, a pattern defining layer and a phase shifter. The reticle has a black border region and a pattern region surrounded by the black border region. The reflective structure is deposited over the substrate. A frame trench is formed in the reflective structure relative to the black border region of the reticle. The pattern defining layer is deposited over the reflective structure relative to the pattern region of the reticle and having a pattern trench formed in the pattern defining layer. The phase shifter is deposited in the pattern trench. An upper surface of the reticle relative to the pattern region, collectively defined by the pattern defining layer and the phase shifter, is a flat surface.

In accordance with some other embodiments, a method for fabricating a reticle is provided. The method includes providing a substrate. The method further includes forming a reflective structure over the substrate. The method also includes depositing a pattern defining layer, which includes a first material over the reflective structure. In addition, the method includes forming a pattern trench in the pattern defining layer. The method further includes depositing a phase shifter, which includes a second material, in the pattern trench. A transmittance of the second material is different from a transmittance of the first material.

The preceding summary is provided to facilitate an understanding of some of the innovative features unique to the present disclosure, and is not intended to be a full description. A full appreciation of the disclosure can be gained by taking the entire specification, claims, drawings, and abstract as a whole.

BRIEF DESCRIPTION OF THE DRAWINGS

The disclosure may be more completely understood in consideration of the following description of various illustrative embodiments in connection with the accompanying drawings, in which.

Figure 1:
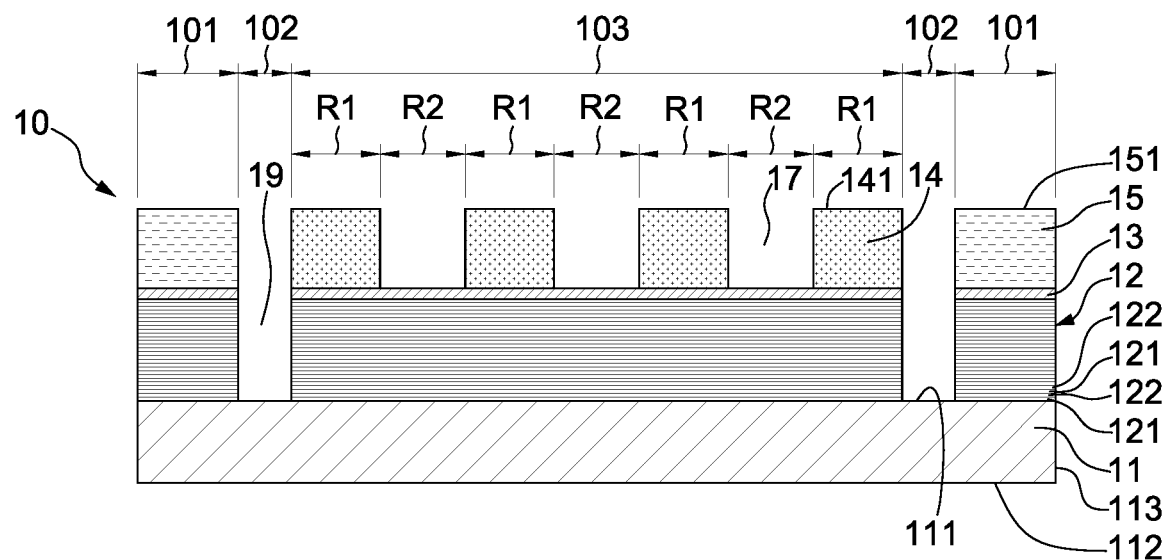
FIG. 1 shows a cross-sectional view of a reticle having a semi-dark pattern defining layers according to some embodiments of the disclosure.

While the disclosure is amenable to various modifications and alternative forms, specifics thereof have been shown by way of examples in the drawings, and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DESCRIPTION

As used in this specification and the appended claims, the singular forms "a," "an," and "the" include plural referents unless the content clearly dictates otherwise. As used in this specification and the appended claims, the term "or" is generally employed to include "and/or" unless the content clearly dictates otherwise.

The following detailed description will be read with reference to the drawings in which similar elements in different drawings are numbered with similar reference numerals. For example, reticles are referred to generically or collectively by numerical reference 10, and individually by numerical reference 10 followed by a letter suffix (e.g., 10a). The detailed description and the drawings, which are not necessarily to scale, depict illustrative embodiments and are not intended to limit the scope of the disclosure. The illustrative embodiments depicted are intended only to be exemplary. Selected features of any illustrative embodiment may be incorporated into an additional embodiment unless clearly stated to the contrary.

FIG. 1 shows a cross-sectional view of a reticle 10 according to some embodiments of the present disclosure. Herein, the term reticle may be used to refer to quartz blanks, photo-masks, or EUV masks. In accordance with some embodiments, the reticle 10 is a reflective-type reticle. It is noted that the embodiments and concepts depicted herein are applicable to any reticle involving a small pitch between two neighboring patterns, including, but not limited to, transmission-type reticles. In some embodiments, the reticle is used in a photolithography process which works in a short radiation light such as extreme ultraviolet (EUV) having a wavelength of about 1 nm to about 100 nm, although other wavelengths of light (radiation) are contemplated by the present disclosure. In the depicted embodiment, the mask 10 is a phase difference mask, such as an attenuated phase difference mask (AttPSM).

In some embodiments, the reticle 10 defines a peripheral region 101, a black border region 102 and a pattern region 103. As seen from a top view of the reticle 10, the pattern region 103 is located at the center of the reticle 10. The pattern region 103 is an area of the reticle 10 that includes a central region of an integrated circuit device (or chip). For example, the reticle 10 includes a pattern of a resistor, a capacitor, an inductor, a diode, a metal-oxide-semiconductor field effect transistor (MOSFET), a complementary MOS (CMOS) transistor, a bipolar junction transistor (BJT), a laterally diffused MOS (LDMOS) transistor, a high power MOS transistor, a fin-like field effect transistor (FinFET), other integrated circuit components, or a combination thereof. In the depicted embodiment, the reticle 10 includes a pattern of via holes of an integrated circuit device (or chip). The black border region 102 extends around the pattern region 103 and is adjacent to the pattern region 103. The width of the black border region 102 may be in a range from about 2 mm to about 3 mm. A frame trench 19 is formed in the black border region 102 of the reticle 10 to reduce unwanted exposure. The peripheral region 101 extends around the black border region 102 and is located between the black border region 102 and an outer edge of the substrate 11. The peripheral region 101 does not include a pattern of an integrated circuit device. Structural features of the reticle 10, in accordance with some embodiments of the present disclosure, are described below in detail.

Figure 2:
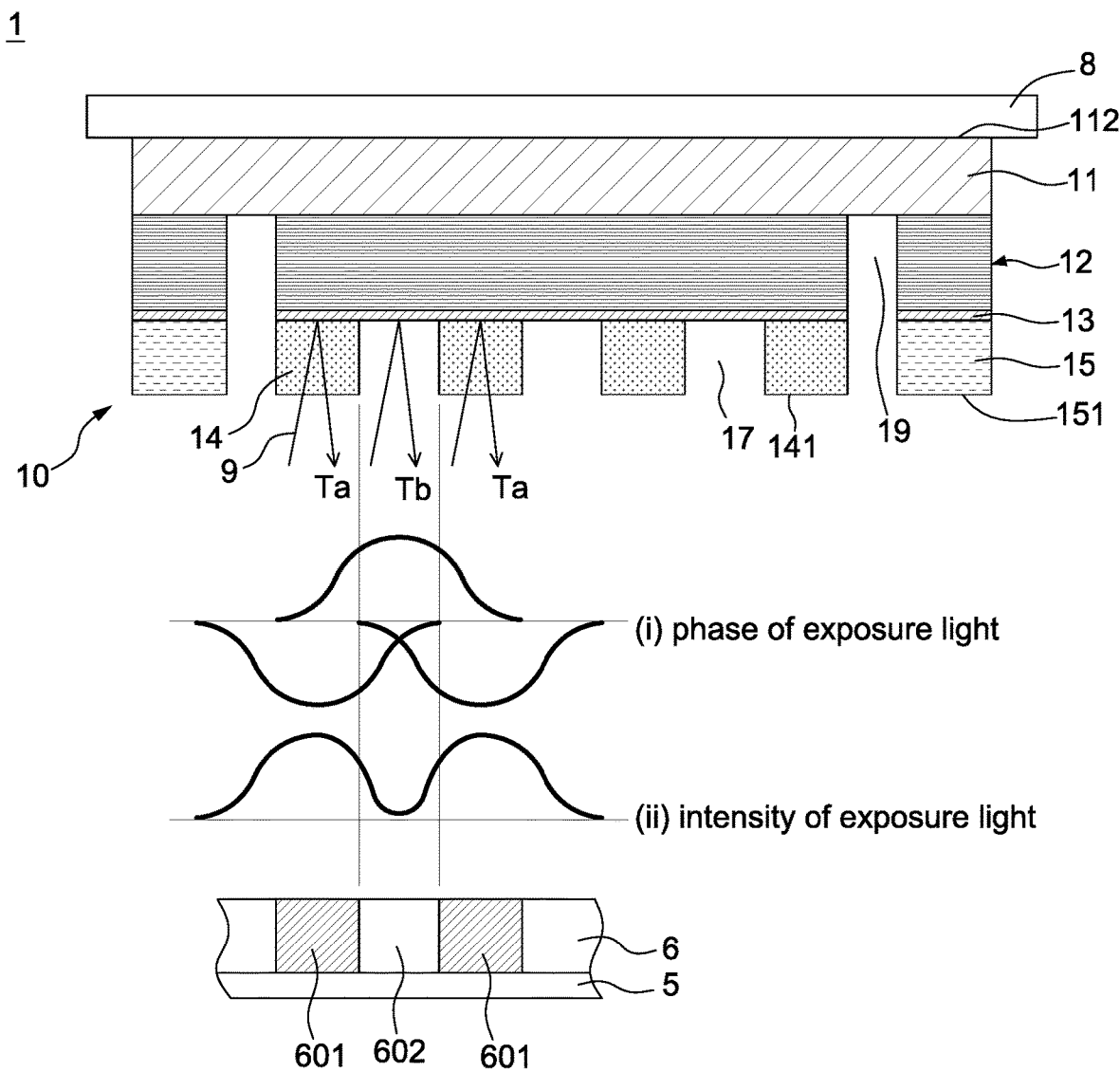
FIG. 2 shows a schematic view of a reticle being subjected to a radiation light and diagrams plotting wave phase (i) and energy intensity (ii) of the radiation light after being reflected from the reticle according to some embodiments of the disclosure.

In some embodiments, the reticle 10 includes a substrate 11, a reflective structure 12, a capping layer 13, a pattern defining layer 14 and an absorber layer 15. The substrate 11 is generally rectangular-shaped with a top surface 111 and a bottom surface 112. The top surface 111 is opposite to the bottom surface 112 and is spaced apart from the bottom surface 112 by a lateral surface 113. The bottom surface 112 may be used as a reference surface during the manufacture and handling of the reticle 10. For example, the bottom surface 112 may be held by an electrostatic chuck 8 in an exposure apparatus 1 (FIG. 2). In some embodiments, the substrate 11 is made of material having a low coefficient of thermal expansion so as to minimize image distortion due to thermal heating. Non-limiting examples of low coefficient of thermal expansion materials include glass, ceramics or glass-ceramics. A conductive layer may be formed over the bottom surface 112 for the purpose of electrostatic chucking. The conductive layer may include tantalum boron (TaB) or chromium nitride (CrN) and may be formed on the bottom surface 112 through suitable deposition techniques.

The reflective structure 12 is configured to reflect radiation light projected on the reticle 10. In some embodiments, the reflective structure 12 is disposed over the top surface 111 of the substrate 11 and covers portions of the top surface 111 that are located in the peripheral region 101 and the pattern region 103 of the reticle 10. In some embodiments, the reflective structure 12 includes a number of film pairs, and each film pair includes a first layer 121 and a second layer 122 located below or above the first layer 121. The number of film pairs in the reflective structure 12 may be in a range from twenty to eighty. For example, the reflective structure 12 includes forty film pairs. In some embodiments, the first layer 121 and the second layer 122 of each film pair are made of two different materials which have different indices of refraction at the exposure wavelength. According to an embodiment, the first layer 121 of the film pairs is a silicon layer, and the second layer 122 of the film pairs is a molybdenum layer. In one embodiment, the first layer 121 of the film pairs is a beryllium layer, and the second layer 122 of the film pairs is a molybdenum layer. The different reflective layers of the first and the second layers 121 and 122 results in a high reflectivity to a selected electromagnetic radiation type/wavelength exposure light.

The thickness of each film pair of the reflective structure 12 may be determined based on the wavelength and the incident angle of the exposure light. Particularly, the thickness of the first and second layers 121 and 122 is determined such that a maximum constructive interference of the exposure light diffracted at each interface and a minimum absorption of the exposure light can be achieved. For example, for the purpose of EUV photolithography, the first layer 121 (e.g., silicon layer) has a thickness of about 4 nm, and the second layer 122 (e.g., molybdenum layer) has a thickness of about 3 nm, arranged such that the reflective structure 12 exhibits a reflectivity of about 70% to the radiation light within the EUV range.

The capping layer 13 is disposed on a side of the reflective structure 12 that is opposite to the substrate 11 and is configured to protect the underlying reflective structure 12 during the formation of the pattern defining layer 14. For example, the capping layer 13 is selected from a material which exhibits different etching characteristics from the pattern defining layer 14. As a result, the capping layer 13 serves as an etch stop layer in patterning or repairing/cleaning the pattern defining layer 14. Non-limiting examples of the capping layer 13 include titanium oxide (Tio) or ruthenium (Ru). The capping layer 13 may be formed on the reflective structure 12 through suitable film deposition techniques with a thickness in a range from about 2 nm to about 4 nm.

The pattern defining layer 14 is disposed on the capping layer 13 and covers a portion of the capping layer 13 that is located in the pattern region 103 of the substrate 11. The pattern defining layer 14 includes very fine patterns that are used to define an image of the exposure light reflected by the reticle 10 so as to impress corresponding patterns on a photoresist material coated on a semiconductor wafer. For example, the pattern defining layer 14 is etched to have a number of pattern trenches 17. The pattern trenches 17 pass through the pattern defining layer 14 and expose portions of the capping layer 13 or reflective structure 12, and are used to define a number of via holes and/or trench lines on a semiconductor wafer in a photolithography process. In some embodiments, the pattern defining layer 14 is semi-dark so as to allow exposure light to impinge into the pattern defining layer 14 and to be reflected by the reflected structure 12 so as to expose the photoresist material coated on the semiconductor wafer. Herein, the pattern defining layer 14 is "semi-dark," which means that the transmittance of a pattern defining layer 14 relative to the exposure light is greater than 0% (i.e., the pattern defining layer is translucent relative to the exposure light); in some embodiments, the transmittance of the pattern defining layer 14 relative to the exposure light (e.g., EUV light) is greater than 50%; in one preferred embodiment, the transmittance of the pattern defining layer 14 relative to the exposure light is in a range of about 60% to about 70%. Non-limiting examples of the material of the pattern defining layer 14 include molybdenum (Mo), niobium (Nb), palladium (Pd), or ruthenium (Ru) or a mixture thereof.

The absorber layer 15 is disposed over the reflective structure 12 and covers a portion of the capping layer 13 that is located in the peripheral region 101 of the reticle 10. In some embodiments, the absorber layer 15 has an absorbance at the exposure light that is greater than an absorbance of the pattern defining layer 14 at the same exposure light. For example, the absorber layer 15 has an absorbance of at least 50% at the exposure light, and the pattern defining layer 14 has an absorbance of less than 50% at the same exposure light. In some embodiments, the reflectivity of the absorber layer 15 is about 2.7% at the exposure light within the EUV range.

The absorber layer 15 is made of material different from that of the pattern defining layer 14. In one embodiment, the absorber layer 15 includes tantalum-based materials with essentially no oxygen, such as tantalum silicide-based materials (TaSi), nitrogenized tantalum boride-based materials (TaBN), and tantalum nitride-based materials (TaN). In another embodiment, the absorber layer 15 includes tantalum- and oxygen-based materials, such as oxidized and nitrogenized tantalum and silicon-based materials (TaSiON), tantalum boron oxide-based materials (TaBO), and oxidized and nitrogenized tantalum-based materials (TaON). The absorber layer 15 may be pattern free (i.e., no features for forming circuit patterns on the semiconductor wafer) and a top surface 151 of the absorber layer 15 is planar. One or more alignment marks may be formed in the absorber layer 15.

In some embodiments, the top surface 151 of the absorber layer 15 and a top surface 141 of the pattern defining layer 14 are located at the same plane. That is, the absorber layer 15 and the pattern defining layer 14 have the same height relative to the reflective structure 12. In some embodiments, the absorber layer 15 serves as a supporting plane of the reticle 10 during the storing of reticle 10 in a reticle pod. By forming the top surface 141 having the same level with the top surface 151, the fine features formed in the pattern defining layer 14 can be protected from being damaged due to collision with an inner surface of the reticle pod.

In some embodiments, the frame trench 19 is formed by etching down the absorber layer 15, the capping layer 13 and the reflective structure 12 to expose the substrate 11 underneath the reflective structure 12 which has low reflectivity. When dies on a semiconductor wafers are arranged in a dense spacing, an image boarder of one exposure shot will overlap part of the neighboring die, which adversely affects critical dimension and contrast of the features formed at the edge of the die. To reduce such unwanted exposure light during the photolithography process, the reflective structure 12 in the black border region 102 is removed such that little or no exposure light is reflected from the reticle 10 in the black border region 102. In some embodiments, a reflectivity at the black border region 102 of the reticle 10 is, for example, less than or equal to about 0.5%, or particularly less than or equal to about 0.05%. In some embodiments, the black border region 102 is frame-shaped and surrounds the pattern region 103. In some embodiments, a width of the frame trench 19 ranges, for example, from about 2 mm to about 3 mm.

FIG. 2 shows one stage of a method for performing a photolithography process with the use of the reticle 10 in an exposure apparatus 1, in accordance with some embodiments of the present disclosure. For the purpose of brevity, optics for transmitting the exposure light in the exposure apparatus 1 are omitted. In some embodiments, when the reticle 10 is transferred into the exposure apparatus 1, the reticle 10 is held by the reticle chuck 8 of the exposure apparatus 1 with the top surface 141 of the pattern defining layer 14 and the top surface 151 of the absorber layer 15 facing downwards. The reticle 10 may be placed in parallel to a semiconductor wafer 5 located below.

Before the photolithography process, the semiconductor wafer 5 may be coated with a photoresist layer 6 including light-sensitive material. The photoresist layer 6 may be positive tone or alternatively negative tone. In the depicted embodiment, the photoresist layer 6 is a negative tone photoresist in which a portion of the photoresist that is exposed to light becomes insoluble to a photoresist developer, and an unexposed portion of the photoresist is dissolved by the photoresist developer. A non-Limiting example of the material of the negative tone photoresist is metal oxide resist.

To implement a photolithography process, an exposure light 9, such as EUV light, is generated from a light source (not shown in figures) and is projected on the pattern defining layer 14 of the reticle 10. The exposure light 9 is then reflected by the reflective structure 12 and transfers patterns from the reticle 10 to the photoresist layer 6 coated on a semiconductor wafer 5.

Specifically, as shown in FIG. 2, due to a transparency property of the pattern defining layer 14, a portion of the exposure light 9 is incident to the pattern defining layer 14 and is reflected by the reflective structure 12 underneath the pattern defining layer 14 to generate a reflected light Ta having patterns associated with the pattern defining layer 14. Furthermore, another portion of the exposure light 9 passes through to the pattern trenches 17 and is reflected by the reflective structure 12 to generate a reflected light Tb having patterns associated with the pattern trenches 17 of the pattern defining layer 14.

The exposure light 9 may undergo a phase change while passing through the pattern defining layer 14, which causes a phase difference between the reflected light Ta and the reflected light Tb. Diagram (i) in FIG. 2 shows a wave phase of the reflected light Ta and the reflected light Tb when they leave the reticle 10. As shown in the diagram (i), the phase of the reflected light Ta is different from the phase of the reflected light Tb. The phase difference between the reflected light Ta and the reflected light Tb may vary depending on a traveling length of the reflected light Ta in the pattern defining layer 14. In some embodiments, a thickness of the pattern defining layer 14 is selected such that a phase difference between the reflected light Ta and the reflected light Tb ranges from about $\pi$ to about $1.3\pi$.

With the phase difference between the reflected light Ta and the reflected light Tb, wave interference occurs. As a result, as shown in diagram (ii) in FIG. 2, a region 602 of the photoresist layer 6 that is associated with one of the pattern trenches 17 is exposed by light having the lowest intensity. In contrast, a region 601 of the photoresist layer 6 that is associated with the pattern defining layer 14 is exposed by light having a greater intensity. In the configuration where the photoresist layer 6 is negative tone, the intensity of the exposure light exposed on the region 602 is so low that the chemical structure of the photoresist layer 6 is not changed, and is therefore removed after the subsequent developing process.

Various examples of reticles which exhibit phase-shift phenomenon similar to that of reticle 10 will be described below. In the below descriptions, structural features of the reticle that is similar to the those of the reticle 10 shown in FIG. 1 will not be repeated for the sake of brevity.

Figure 3A:
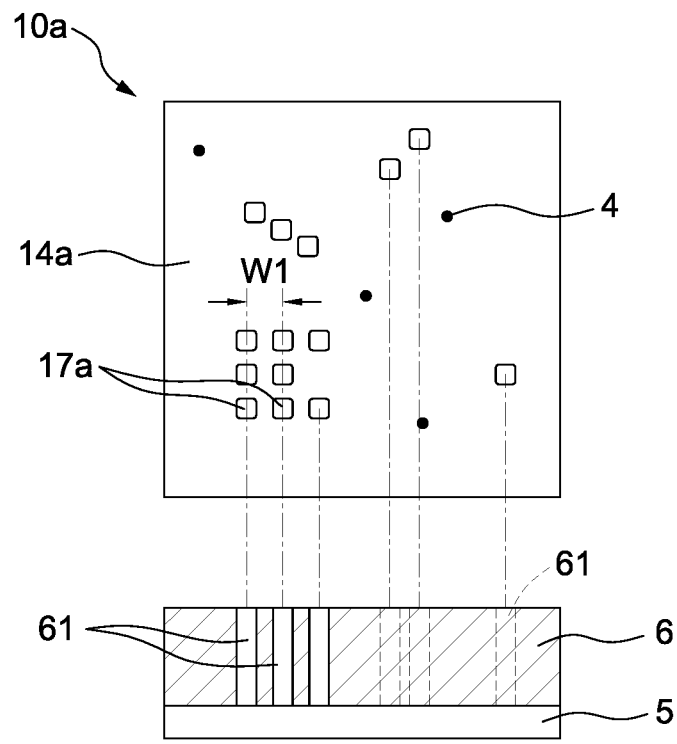
FIG. 3A shows a schematic view of one stage of a photolithography process as a negative tone photoresist being exposed to a radiation light from a reticle used to define vertical interconnect access holes according to some embodiments of the disclosure.

FIG. 3A shows a schematic view of one stage of a photolithography process as a negative tone photoresist being exposed to a radiation light from a reticle 10a used to define vertical interconnect access holes on a photoresist layer 6 according to some embodiments of the present disclosure. It should be understood that pattern trenches on the reticle 10a and openings on the photoresist layer 6 in the drawing are illustrated for explanation of the invention and not necessarily scaled to meet actual conditions. In one embodiment, the dimensions of the pattern trenches on the reticle 10a are four times larger than those of openings on the photoresist layer 6. In some embodiments, the retile 10a has a pattern defining layer 14a formed with the semi-dark material, and a number of pattern trenches 17a are formed in the pattern defining layer 14a. As seen from a bottom view of FIG. 3A, the pattern trenches 17a may have a square shape with a width ranging from about 60 nm to about 100 nm. A spacing W1 between two pattern trenches 17a that are arranged next to each other ranges from 20 nm to micrometers. To form a number of openings 61 associated with the pattern trenches 17a on the photoresist layer 6 which has a negative tone, an exposure light that carries the patterns of the reticle 10a is projected on the photoresist layer 6. Afterwards, the photoresist layer 6 is subjected to a developing solution to remove a portion of the photoresist layer 6 that is not exposed by the exposure light or is exposed by light having an intensity lower than an intensity needed to trigger a chemical structure change in the photoresist layer 6.

As compared with a photolithography process using a conventional dark field binary reticle (i.e., pattern trenches are formed in an opaque absorber material that is formed in a pattern region of a reticle) to define via holes on a positive tone photoresist, the photolithography process shown in FIG. 3A has a smaller resist blur. According to one simulation result, the former process has a resist blur of 3.5 nm and the latter process has a resist blur of less than 2 nm. Therefore, the via holes which have a small spacing (e.g., less than 40 nm) can even be formed at same time with the use of a single reticle, and thus manufacturing time and costs are significantly reduced. In addition, due to the semi-dark property of the pattern defining layer 14a, an output power to generate the exposure light can be reduced in comparison with the conventional binary reticle, and thus power demands for this photolithography process are reduced. Moreover, the photolithography process shown in FIG. 3A exhibits a better critical dimension uniformity and a better hole circularity.

As compared with a photolithography process using a conventional bright field binary reticle (i.e., dot-like absorber structures are formed on a reflective structure in a pattern region of a reticle) to define via holes on a negative tone photoresist, the photolithography process shown in FIG. 3A presents a better image contrast. As a result, the openings 61 formed by reticle 10a have a better critical dimension uniformity and a better hole circularity. In addition, the photolithography process shown in FIG. 3A has a better ability to inhibit image defects due to particles or residues (such as particles 4 shown in FIG. 3A, accumulated on the reticle 10a) in comparison with a photolithography process using the bright field binary reticle.

Figure 3B:
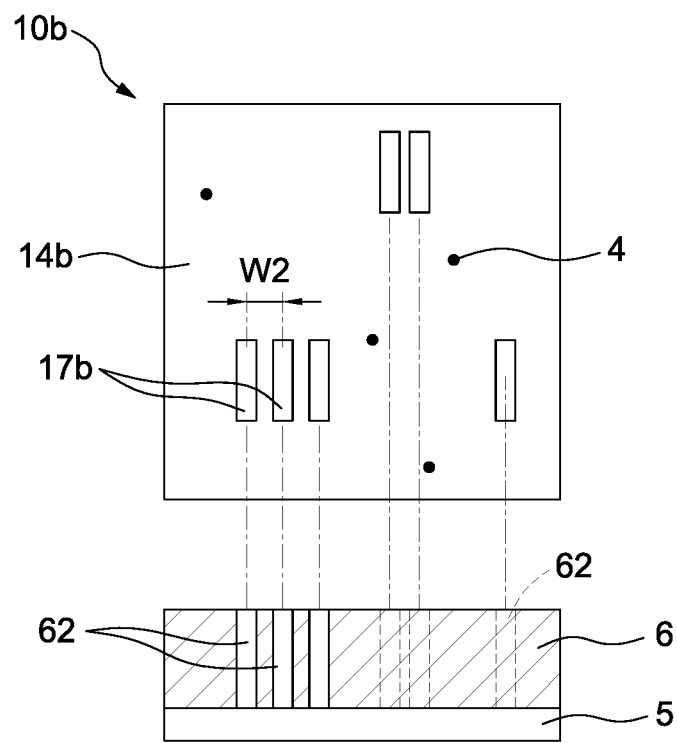
FIG. 3B shows a schematic view of one stage of a photolithography process as a negative tone photoresist being exposed to radiation light from a reticle used to define trench lines according to some embodiments of the disclosure.

FIG. 3B shows a schematic view of one stage of a photolithography process as a negative tone photoresist being exposed to radiation light from a reticle 10b used to define trench lines on a photoresist layer 6 according to some embodiments of the present disclosure. It should be understood that pattern trenches on the reticle 10b and trenches on the photoresist layer 6 are illustrated for explanation of the invention and not necessarily scaled to meet actual conditions. In one embodiment, the dimensions of pattern trenches on the reticle 10b are four times larger than those of trenches on the photoresist layer 6. In some embodiments, the reticle 10b has a pattern defining layer 14b formed with the semi-dark material, and a number of pattern trenches 17b are formed in the pattern defining layer 14b. As seen from a bottom view of FIG. 3B, the pattern trenches 17b may have a rectangular shape. A spacing W2 between two pattern trenches 17b that are arranged next to each other ranges from 12 nm to micrometers. To form a number of trenches 62 associated with the pattern trenches 17b on the photoresist layer 6 which has negative tone, an exposure light that carries the patterns of the reticle 10b is projected on the photoresist layer 6. Afterwards, the photoresist layer 6 is subjected to a developing solution to remove a portion of the photoresist layer 6 that is not exposed by the exposure light or is exposed by light having an intensity lower than an intensity needed to trigger a chemical structure change in the photoresist layer 6.

In a conventional photolithography process, the trench lines are formed by the following stages: forming photoresist lines on a substrate by using a dark field binary reticle to define patterns on a negative tone photoresist; deposit a reverse material which exhibits different etching characteristics from the photoresist lines on the substrate; and etching back the photoresist lines. However, in the above photolithography process, the pattern lines may collapse during or before the deposition of the reverse material. On the contrary, the photolithography process shown in FIG. 3B effectively mitigates the concerns of pattern collision, because the trench lines can be directly formed without performing the reverse process.

As compared with a photolithography process using a conventional bright field binary reticle to define trench lines on a negative tone photoresist, the photolithography process shown in FIG. 3B presents a better image contrast. As a result, the openings 62 formed by reticle 10b have a better line width roughness (LWR) and critical dimension uniformity. In addition, the photolithography process shown in FIG. 3B has a better ability to inhibit image defects due to particles or residues (such as particles 4 shown in FIG. 3B) accumulated on the reticle 10b in comparison with a photolithography process using the bright field binary reticle.

The inventors of the present disclosure found that when the intensity of the reflected light Ta (FIG. 2) is closer to the intensity of the reflected light Tb (FIG. 2), the wave interference of the reflected light Ta and the reflected light Tb becomes amplified. In the other words, the greater ratio of the transmittance of the pattern defining layer 14 to the transmittance of a medium deposited in the pattern trenches 17 makes a better image contrast of the patterns projected on the semiconductor wafer. Generally, the EUV photolithography process is performed in an ultra-vacuum environment, and thus the pattern trenches 17 is devoid of gas (i.e., the transmittance of a medium deposited in the pattern trenches 17 is approximately equaled to 1.) To increase the ratio of the transmittance of the pattern defining layer 14 to the transmittance of a medium deposited in the pattern trenches 17, another objective of the present disclosure is to provide a reticle which has one or more phase shifters positioned in the pattern trenches in the pattern defining layer 14, thereby intensifying the interference of the reflected light Ta and the reflected light Tb.

Figure 4:
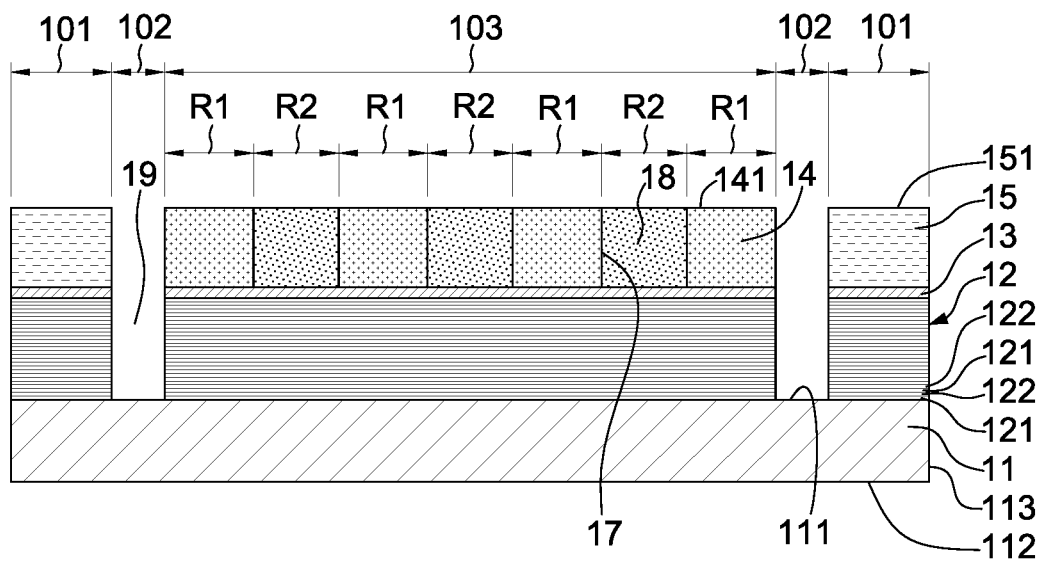
FIG. 4 shows a cross-sectional view of a reticle having a semi-dark pattern defining layer according to some embodiments of the disclosure.

FIG. 4 shows a cross-sectional view of a reticle 10c similar to the reticle 10 in FIG. 1, and differences between the reticle 10c and the reticle 10 include the pattern trenches 17 being filled with a number of phase shifters 18. In some embodiments, the entire area of a top surface of the reflective structure 12 in the pattern region 103 of reticle 10c consists of the first region R1 and the second region R2 of the reflective structure 12. As shown in FIG. 4, the pattern defining layer 14 covers the first region R1 of the reflective structure 12. The pattern defining layer 14 may be disposed over the first region R1 of the reflective structure 12, and the capping layer 13 is positioned between the reflective structure 12 and the pattern defining layer 14. The phase shifters 18 are located in the pattern trenches 17 and cover the second region R2 of the reflective structure 12. The phase shifters 18 may be disposed over the second region R2 of the reflective structure 12, and the capping layer 13 is positioned between the reflective structure 12 and each of the phase shifters 18.

In some embodiments, the pattern defining layer 14 is formed of a first material, and the phase shifters 18 are formed with a second material which is different from the first material. An exemplary combination of the first material and the second material, in accordance with some embodiments of the present disclosure, are shown in Table 1 and Table 2.

TABLE 1 combinations of material of pattern defining layer 14 (first material) and phase shifter 18 (second material) and relevant parameters as light emitting from the pattern defining layer 14 and the phase shifter 18 having a phase difference of $\pi$

| $1^{st}$ material | $2^{nd}$ material | Transmittance of $2^{nd}$ material | Transmittance ratio of 1st and $2^{nd}$ materials | Thickness of $1^{st}$ and $2^{nd}$ materials (nm) |
|---|---|---|---|---|
| Molybdenum (Mo) | Zirconium (Zr) | 0.51 | 0.62 | 95.41 |
|  | Lanthanum (La) | 0.66 | 0.88 | 45.63 |
|  | Silicon (Si) | 0.86 | 0.68 | 44.62 |
|  | Carbon (C) | 0.32 | 1.08 | 88.82 |
|  | Boron (B) | 0.56 | 0.72 | 75.28 |
|  | Vacuum | 1.00 | 0.59 | 44.04 |
| Niobium (Nb) | Zirconium (Zr) | 0.39 | 0.70 | 133.09 |
|  | Lanthanum (La) | 0.61 | 0.98 | 52.78 |
|  | Carbon (C) | 0.21 | 1.47 | 120.60 |
|  | Boron (B) | 0.48 | 0.81 | 96.94 |
|  | Vacuum | 1.00 | 0.61 | 50.66 |

TABLE 2 combinations of material of pattern defining layer 14 (first material) and phase shifter 18 (second material) and relevant parameters as light emitting from the pattern defining layer 14 and the phase shifter 18 having a phase difference of 1.2π

| 1st material | 2nd material | Transmittance of 2nd material | Transmittance ratio of 1st and 2nd materials | Thickness of 1st and 2nd materials (nm) |
|---|---|---|---|---|
| Molybdenum (Mo) | Lanthanum (La) | 0.602 | 0.859 | 54.760 |
| | Silicon (Si) | 0.835 | 0.628 | 53.547 |
| | Silicon (SiC) | 0.538 | 0.809 | 68.963 |
| | Polysilicon (pSi) | 0.797 | 0.622 | 58.269 |
| | Vacuum | 1.00 | 0.529 | 52.847 |

Figure 5:
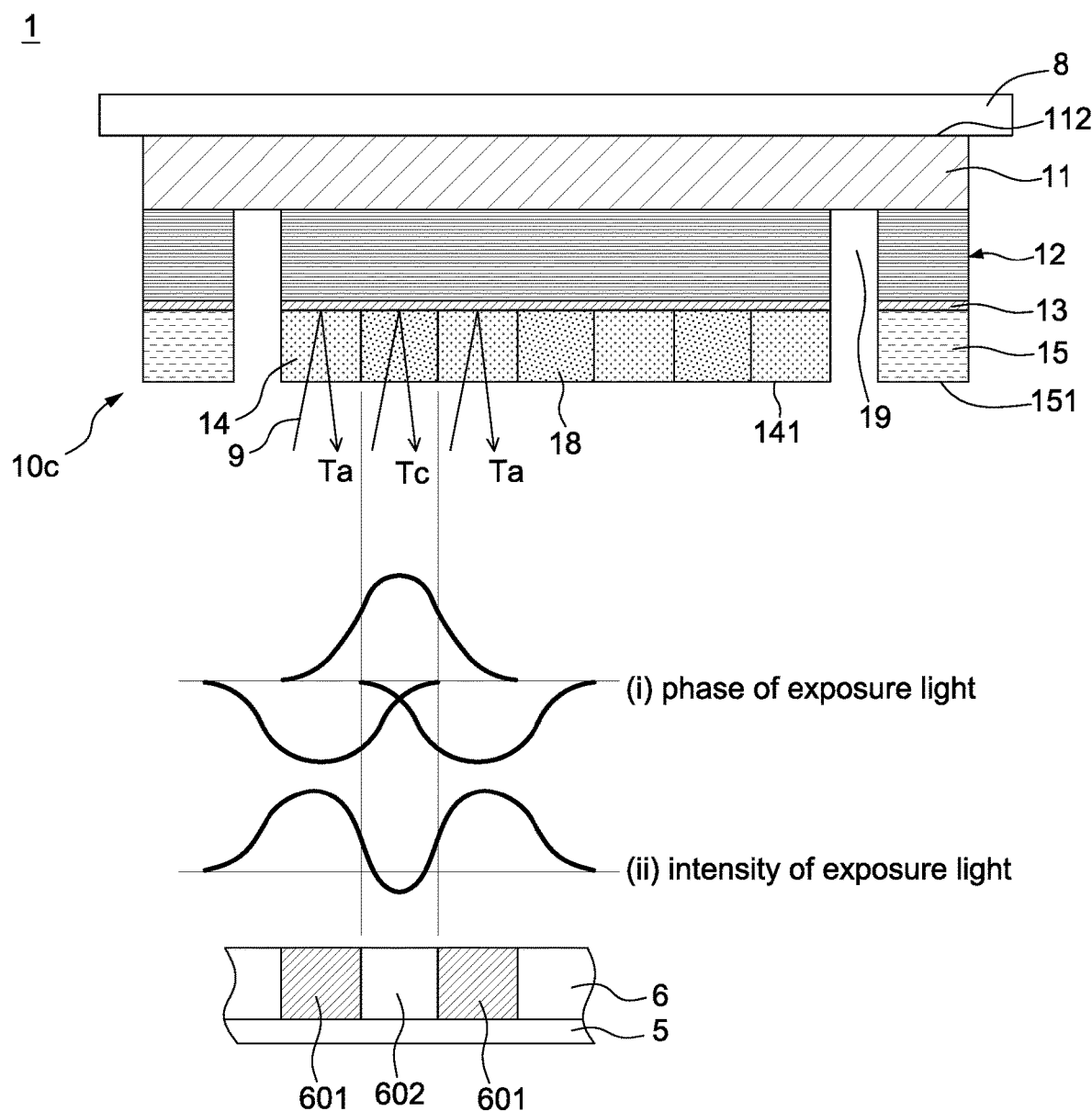
FIG. 5 shows a schematic view of the reticle shown in FIG. 4 being subjected to a radiation light and diagrams plotting wave phase (i) and energy intensity (ii) of the radiation light after being reflected from the reticle according to some embodiments of the disclosure.

Table 1 shows that when the pattern trenches 17 are filled with phase shifters 18 including material selected from Zr, La, Si, C or B the transmittance ratio of the pattern defining layer 14 to the phase shifters 18 is greater than the transmittance ratio of the pattern defining layer 14 to a vacuum (i.e., no phase shifter 18 is formed in the pattern trenches 17.) Table 2 shows that when the pattern trenches 17 are filled with phase shifters 18 including material selected from La, Si, SiC or pSi, the transmittance ratio of the pattern defining layer 14 to the phase shifters 18 is greater than the transmittance ratio of the pattern defining layer 14 to a vacuum. The increase of the transmittance ratio of the pattern defining layer 14 to the phase shifters 18 represents wave interference of the light reflected by the reticle 10c being enhanced, and the image contrast being significantly improved. For example, as shown in FIG. 5, when the reticle 10c is used in a photolithography process, a portion of the exposure light 9 is incident to the pattern defining layer 14 and is reflected by the reflective structure 12 underneath the pattern defining layer 14 to generate a reflected light Ta having patterns associated with the pattern defining layer 14. Furthermore, another portion of the exposure light 9 is incident to the phase shifters 18 and is reflected by the reflective structure 12 underneath the phase shifters 18 to generate a reflected light Tc having patterns associated with the phase shifters 18.

The exposure light 9 undergoes a phase change while passing through the pattern defining layer 14 and the phase shifter 18, which causes a phase difference between the reflected light Ta and the reflected light Tc. Specifically, diagram (i) in FIG. 5 shows a wave phase of the reflected light Ta and the reflected light Tc when they leave the reticle 10c, and diagram (ii) in FIG. 5 shows an intensity of the exposure light 9 projected on the semiconductor wafer 5. As shown in the diagram (i) in FIG. 5, the phase of the reflected light Ta is different from the phase of the reflected light Tc, and amplitude of the phase of the reflected light Tc is greater than amplitude of the phase of the reflected light Ta. As a result, as shown in the diagram (ii) in FIG. 5, a region 602 of the photoresist layer 6 that is associated with one of the phase shifter 18 is exposed by light having the lowest intensity. In contrast, a region 601 of the photoresist layer 6 that is associated with the pattern defining layer 14 is exposed by light having a greatest intensity. Furthermore, effected by the strong amplitude of the reflected light Tc, exposure light Tc transmitted from the phase shifter 18 exhibits a lower intensity than that of the exposure light Ta transmitted from the pattern defining layer 14, which means and interference of the light reflected by the reticle 10c is enhanced and therefore an image contrast is significantly improved.

In some embodiments, both pattern defining layer 14 (first materials) and phase shifter 18 (second material) are alloys that are formed by more than one element atoms. The example of pattern defining layer 14 can be Ni—Al, for example. The selection of alloys as second materials (phase shifter) can be such as long as (1) the ratio of transmission of the first materials (pattern defining layer) to the second materials is more than that of transmission of first materials to that of the vacuum; and (2) the combination of other optical parameters and other related parameters, the thickness of the first materials and second materials will make the phase difference for light passing the first materials and second materials range from about π to about 1.3π, and preferably 1.2 π.

The pattern defining layer can be either single element or alloy, and the phase shifter can also be single element or alloys. The overall system can be a combination of element and alloy according to the pattern defining layer and the phase shifter.

Tables 1 and 2 also shows that in some particular combinations, such as Mo/La, Mo/Si and Nb/La, the thickness of the pattern defining layer 14 and the phase shifters 18 is approximately equals to 50 nm. The pattern defining layer 14 and the phase shifter 18 having such thin thickness may also facilitate the prevention of a shadowing effect and the improvement of light reflectivity of the reticle 10c. That is, the product yield of the semiconductor wafer can be improved. In some embodiments, the pattern defining layer 14 and the phase shifter 18 has a thickness of about 44 nm to about 53 nm.

In addition to the above mentioned advantages, the deposition of the phase shifters 18 in the pattern trenches 17 also provides benefits by reducing power consumption of the exposure apparatus and lowering associated costs. According to one simulation result, when the pattern defining layer 14 is made of Mo and the phase shifters 18 are made of silicon, the power of a single exposure shot to effectively expose the photoresist is reduced by 3% to about 35.0 mj/cm$^2$ from about 36.2 mj/cm$^2$ in comparison with a reticle having no phase shifter 18 deposited in the pattern trenches 17.

It is noted that, to take advantage of the above benefits the phase shift reticle, the phase difference produced by the reticle may be determined by the wavelength of the exposure light. In the present disclosure, the light emitting from the pattern defining layer 14 and the phase shifter 18 may have a phase difference ranging from 1 π to 1.3π, and the relevant parameters of the phase shift reticle are shown in Table 3 below.

TABLE 3 relevant parameters as light emitting from the pattern defining layer 14 (e.g. molybdenum)
and the phase shifter 18 (e.g., lanthanum or silicon) having a phase difference ranging from $\pi$ to $1.3\pi$

| 1st material | 2nd material | Phase difference | Transmittance of 2nd material | Transmittance ratio of 1st and 2nd materials | Thickness of 1st and 2nd materials (nm) |
|---|---|---|---|---|---|
| Mo | La | $1.3\pi$ | 0.58 | 0.85 | 59.32 |
|    | La | $1.2\pi$ | 0.60 | 0.86 | 54.76 |
|    | La | $1.1\pi$ | 0.63 | 0.87 | 50.20 |
|    | La | $1.0\pi$ | 0.66 | 0.88 | 45.63 |
| Mo | Si | $1.3\pi$ | 0.82 | 0.60 | 58.01 |
|    | Si | $1.25\pi$ | 0.829 | 0.616 | 55.780 |
|    | Si | $1.2\pi$ | 0.83 | 0.63 | 53.55 |
|    | Si | $1.15\pi$ | 0.841 | 0.640 | 51.318 |
|    | Si | $1.1\pi$ | 0.85 | 0.65 | 49.08 |
|    | Si | $1.0\pi$ | 0.86 | 0.68 | 44.62 |

FIGS. 6A through 6L show a series of schematic cross-sectional diagrams illustrating a method for forming a reticle 10d (FIG. 6K), in accordance with one embodiment of the present invention. Additional stages can be provided before, during, and after the method, and some stages described can be replaced, eliminated, or moved around for additional embodiments. The method is an example, and is not intended to limit the present disclosure beyond what is explicitly recited in the claims.

Figure 6A:
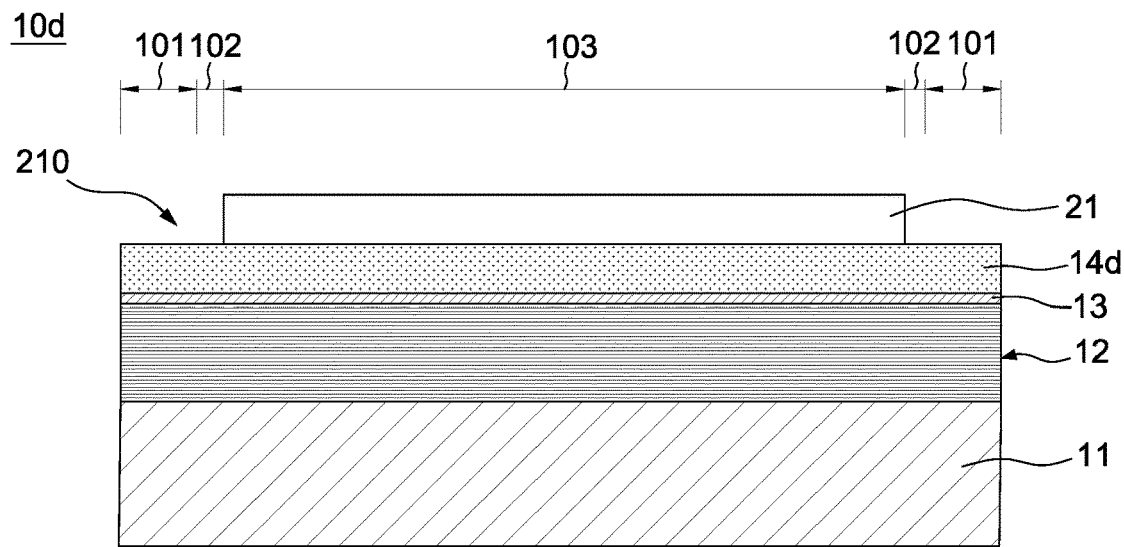
FIGS. 6A through 6K show various stages of a method of fabricating a reticle having a semi-dark pattern defining layer according to some embodiments of the disclosure.

Referring to FIG. 6A, the method for forming a reticle 10d includes forming a reflective structure 12, a capping layer 13 and a pattern defining layer 14d over a substrate 11 in sequence. The pattern defining layer 14d may be selected from molybdenum (Mo), niobium (Nb), palladium (Pd), ruthenium (Ru), or alloys such as Ni—Al. The reflective structure 12, the capping layer 13 and the pattern defining layer 14d may be formed by chemical vapor deposition (CVD), physical vapor deposition (PVD), atomic layer deposition (ALD), and/or another suitable process or processes. In some embodiments, the reflective structure 12 is a multi-layer comprising alternating Mo and Si layers, and each pair of the Mo and Si layers has a Mo layer with a thickness of about 3 nm and a Si layer with a thickness of about 4 nm. The capping layer 13 includes ruthenium (Ru), RuSi, or a combination thereof and has a thickness ranging between about 2 nm and about 20 nm. The pattern defining layer 14d includes molybdenum (Mo) or niobium (Nb) and has a thickness ranging between about 40 nm and about 130 nm.

Still referring FIG. 6A, the method for forming the reticle 10d further includes patterning a region of the pattern defining layer 14d relative to the peripheral region 101 and the black border region 102. The patterning process may include forming a layer of photoresist 21 over the pattern defining layer 14d by a suitable process, such as spin-on coating, and then exposing and developing the layer of photoresist 21 to form a photoresist feature 210. The photoresist feature 210 may be a rectangular shape to expose a top surface of the pattern defining layer 14d relative to the peripheral region 101 and the black border region 102.

Figure 6B:
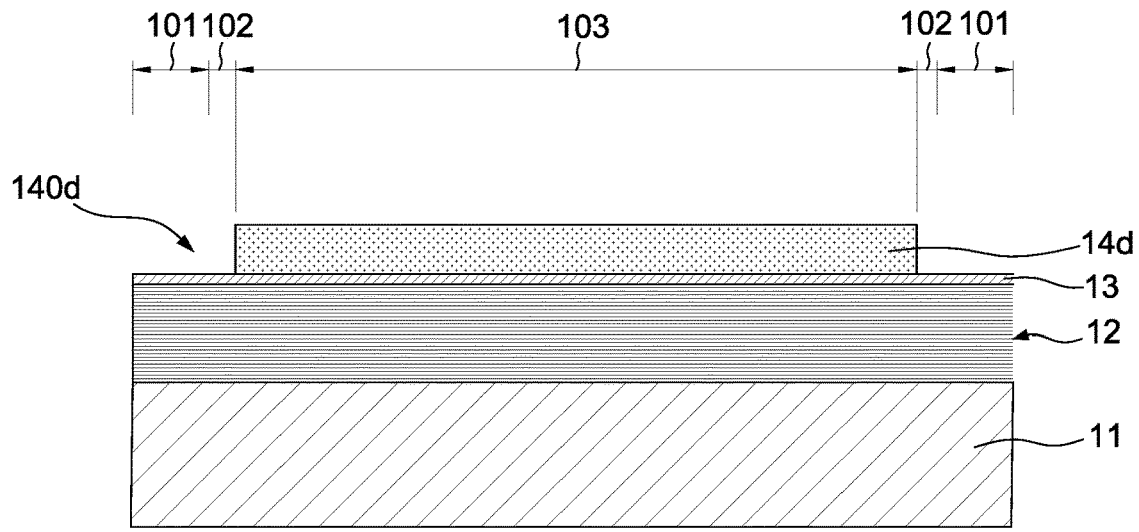

The method for forming the reticle 10d further includes performing an etching process to transfer the patterns of the photoresist feature 210 to the underlying pattern defining layer 14d. In the etching process, the portion of the pattern defining layer 14d uncovered by the photoresist 21 is removed to form an opening 140d therein, as shown in FIG. 6B. The layer of photoresist 21 may be removed after the etching process of the pattern defining layer 14d.

Figure 6C:
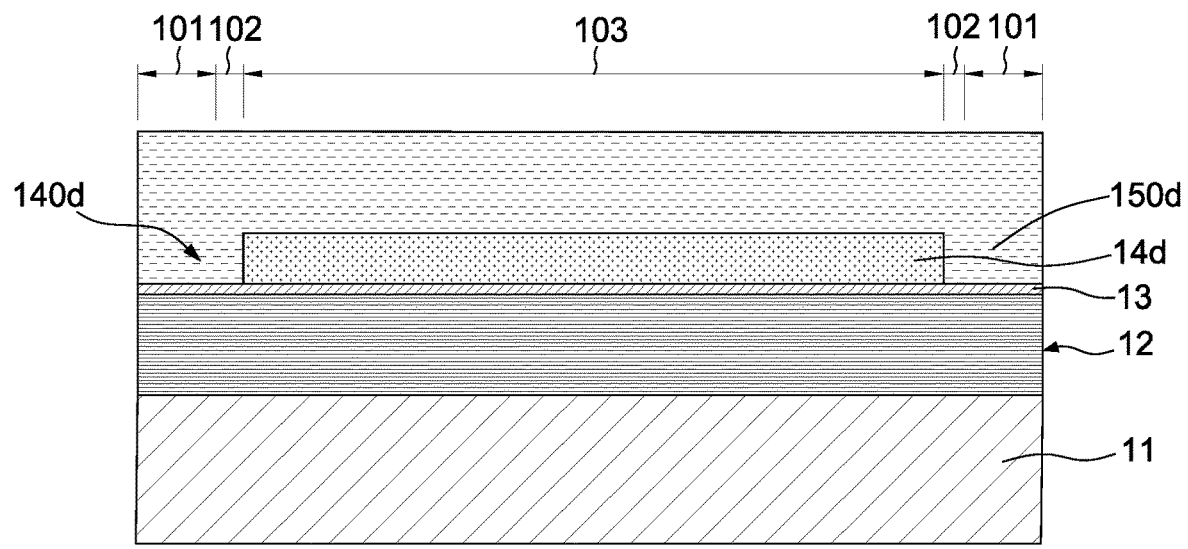

Referring to FIG. 6C, the method for forming the reticle 10d further includes forming an absorber material 150d over the pattern defining layer 14d by chemical vapor deposition (CVD), physical vapor deposition (PVD), atomic layer deposition (ALD), and/or another suitable process or processes. The absorber material 150d may include tantalum silicide-based materials, nitrogenized tantalum boride-based materials, and tantalum nitride-based materials.

Figure 6D:
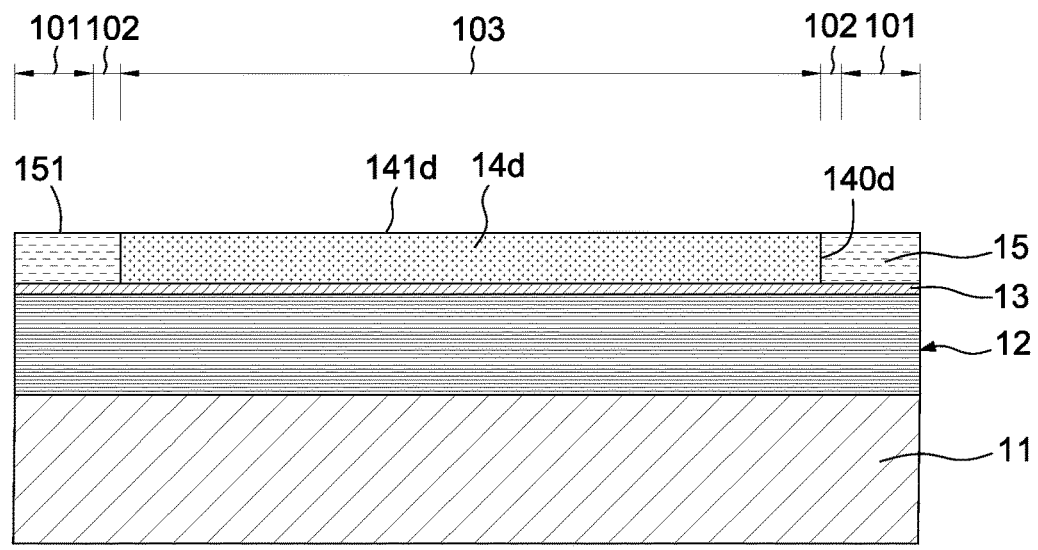

After the formation of the absorber material 150d, as shown in FIG. 6D, a removal process is performed to remove a portion of the absorber material 150d which is above the pattern defining layer 14d and the opening 140d to form the absorber layer 15. The removal process may include a chemical-mechanical polish (CMP) process or a dry etch process. After the removal process, the absorber layer 15 in the opening 140d and the pattern defining layer 14d have the same height relative to the reflective structure 12. A top surface 141d of the pattern defining layer 14d is substantially co-planar with the top surface 151 of the absorber layer 15 such that the pattern defining layer 14d and the absorber layer 15 constitute a planar (even) upper surface of the reticle 10d.

Figure 6E:
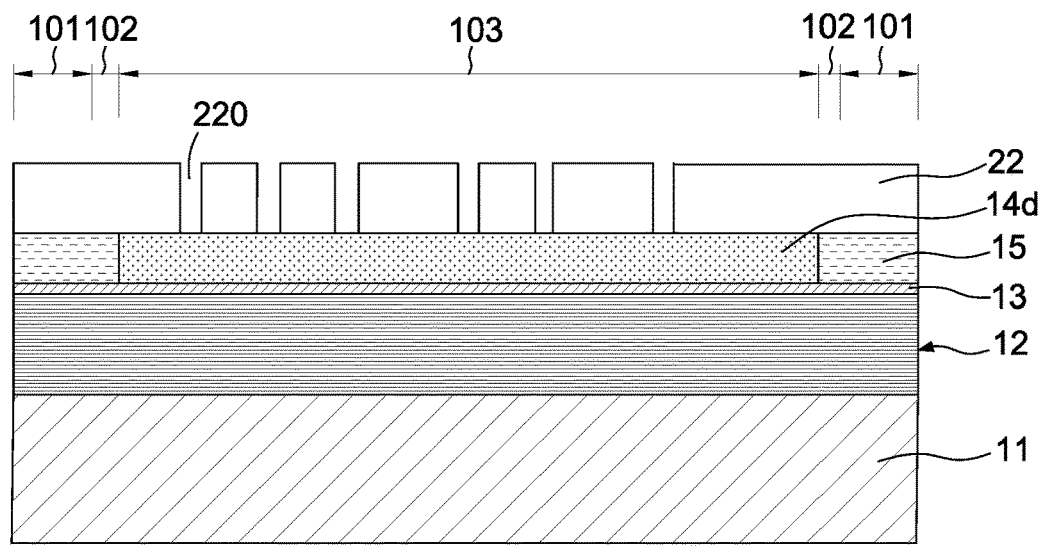

Referring to FIG. 6E, the method for forming the reticle 10d further includes patterning a portion of the pattern defining layer 14d which is located in the pattern region 103. The patterning process may include forming a layer of photoresist 22 over the pattern defining layer 14d and the absorber layer 15 by a suitable process, such as spin-on coating, and then exposing and developing the layer of photoresist 22 to form photoresist features 220. The photoresist feature 220 may be patterned according to a circuit pattern of a layer of an integrated circuit. In some embodiments, the photoresist feature 220 is patterned according to via holes or trench lines of an integrated circuit.

Figure 6F:
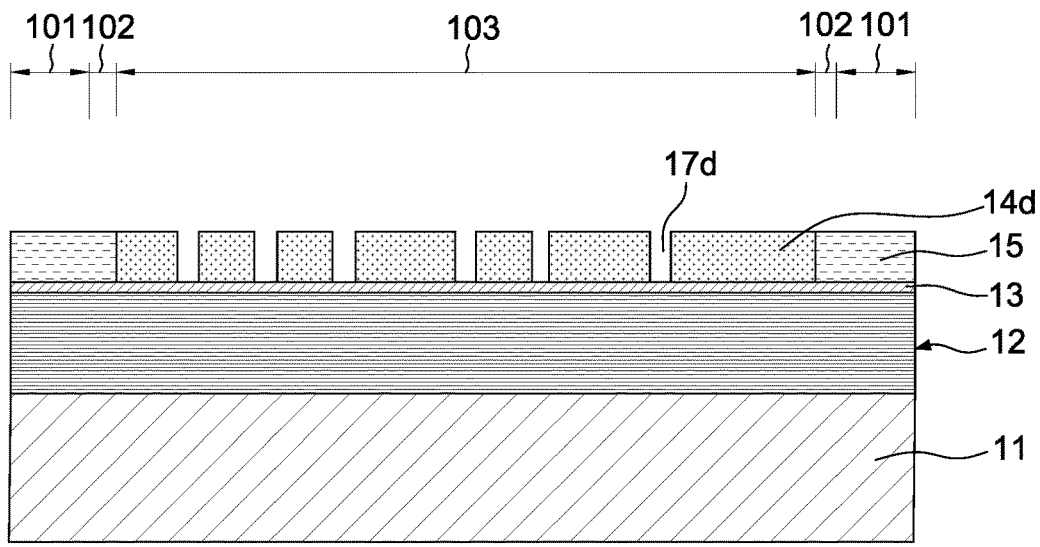

The method for forming the reticle 10d further includes performing an etching process to transfer the patterns of the photoresist features 220 to the underlying pattern defining layer 14d. In the etching process, the portion of the pattern defining layer 14d uncovered by the photoresist 22 is removed to form a number of pattern trenches 17d therein, as shown in FIG. 6F. The layer of photoresist 22 may be removed after the etching process of the pattern defining layer 14d.

After the formation of the pattern trenches 17d, the method for forming the reticle 10d further includes forming a number of phase shifters in the pattern trenches 17d. In some embodiments, the phase shifters are formed in the pattern trenches 17d by a self-assembled monolayers (SAM) process and an area selective deposition (ASD) process.

Figure 6G:
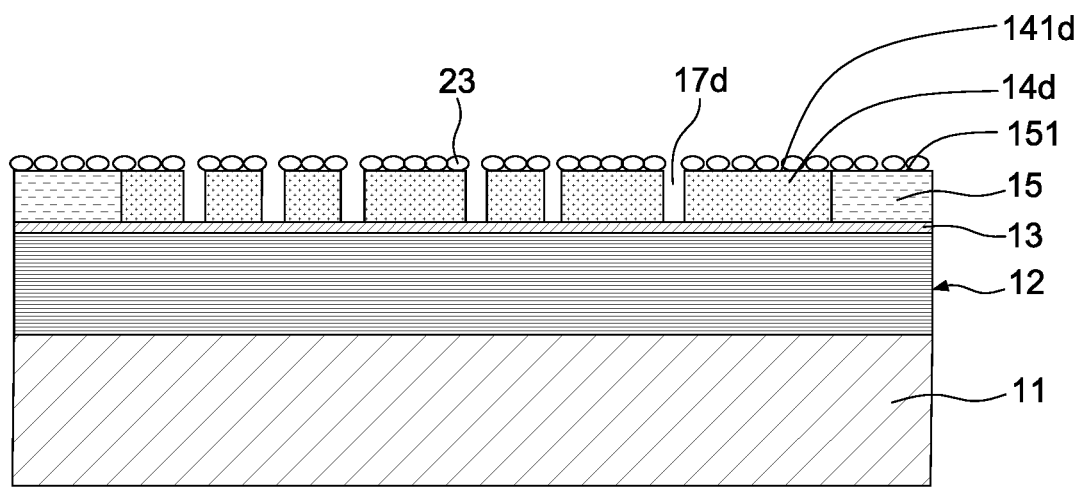
Figure 6H:
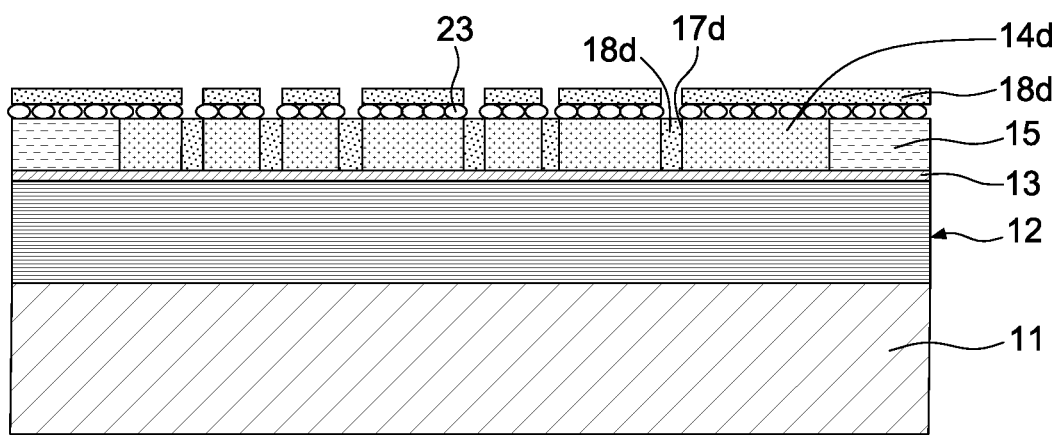
Figure 6I:
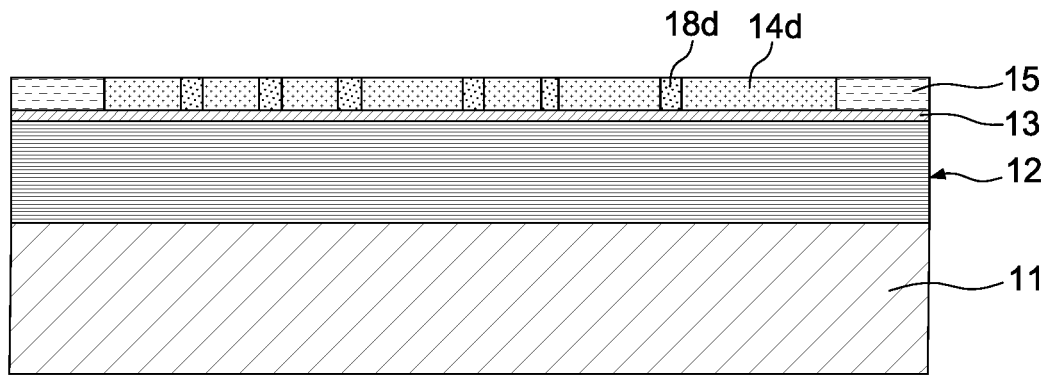

Specifically, in the SAM process, as shown in FIG. 6G, inhibitors 23 are selectively formed on the pattern defining layer 14d and the absorber layer 15. That is, the inhibitors 23 cover the top surface 141d of the pattern defining layer 14d and the top surface 151 of the absorber layer 15, and leave the pattern trenches 17d uncovered. The inhibitors 23 include a material that can suppress subsequent deposition on the pattern defining layer 14d and the absorber layer 15. In some embodiments, the inhibitors 23 may be formed by liquid and/or vapor deposition process. In the ASD process, two chemicals are alternately supplied multiple times over the pattern defining layer 14d and the absorber layer 15. Since the inhibitors 23 are inert with the chemicals of the ASD process, the chemicals are prevented from bonding to the inhibitors 23. As a result, as shown in FIG. 6H, the phase shifters 18d can be selectively formed in the pattern trenches 17d, a thin film 180d of material of the phase shifter may be formed on the pattern defining layer 14d and the absorber layer 15 after the ASD process. Afterwards, the formation of the inhibitors along with the thin film 180d on the inhibitors are removed, as shown in FIG. 6I. In some embodiments, the phase shifter 18d is selected from material includes Zr, La, Si, C or B.

Figure 6J:
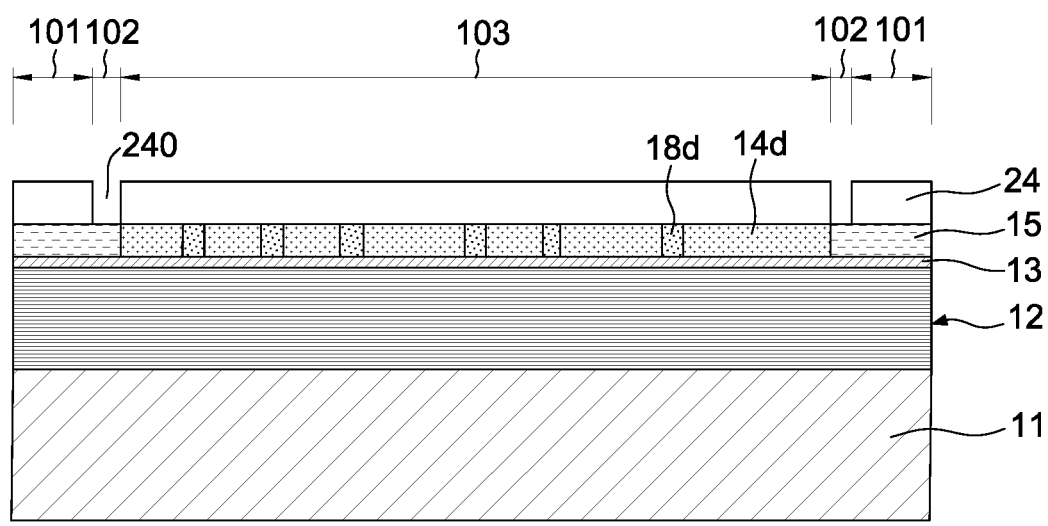
Figure 6K:
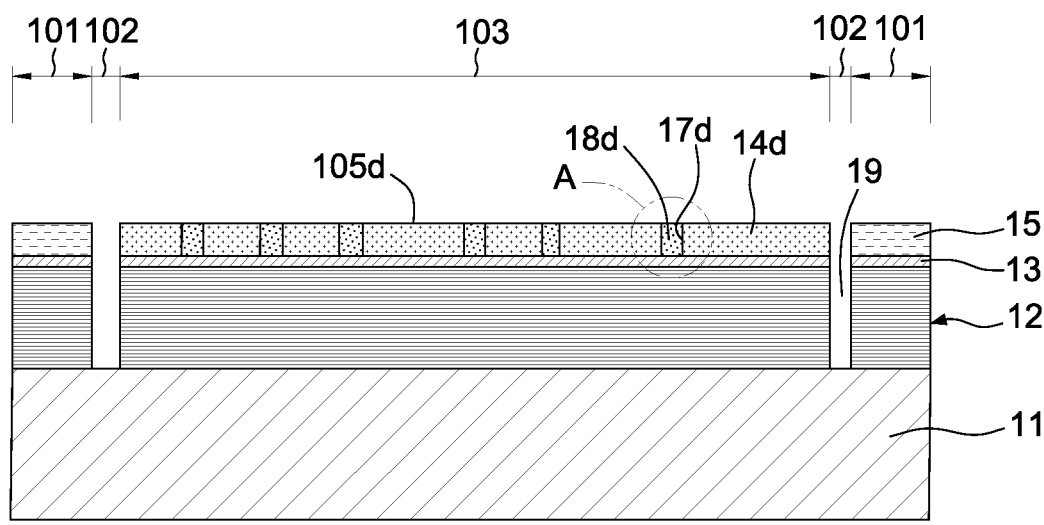

After the formation of the phase shifters 18d, the method for forming the reticle 10d further includes forming a frame trench 19 in a black border region 102 of the reticle 10d. In some embodiments, as shown in FIG. 6J, the formation of the frame trench 19 may include forming a layer of photoresist 24 over the pattern defining layer 14d and the absorber layer 15 by a suitable process, such as spin-on coating, and then exposing and developing the layer of photoresist 24 to form photoresist feature 240. The photoresist feature 240 may have a rectangular shape to expose a top surface of the absorber layer 15 located in the black border region 102. Afterwards, an etching process is performed to transfer the patterns of the photoresist feature 240 to the underlying absorber layer 15. In the etching process, the absorber layer 15, the capping layer 13 and the reflective structure 12 uncovered by the photoresist 24 are removed to form the frame trench 19 therein, as shown in FIG. 6K. The layer of photoresist 24 may be removed after the etching process for forming the frame trench 19. In some embodiments, the reflective structure 12 is completely removed and stops on the surface of the substrate 11.

Figure 6L:
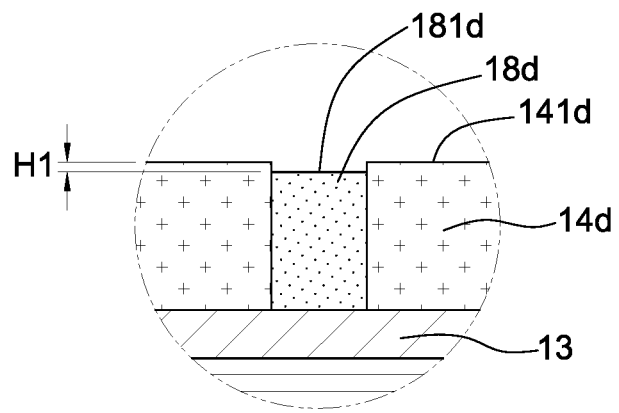
FIG. 6L shows a magnifying view of a region A in FIG. 6K.

In some embodiments, all of the openings or pattern trenches 17 in the pattern defining layer 14d are filled with the phase shifters 18d, and an upper surface 105d of the reticle 10d in the pattern region 103 is a flat surface. In the present disclosure, the "flat surface" is not limited to an ideal flat surface, but also includes a surface which has a variation in height no greater than 5% of a height of the phase shifter 18d. For example, as shown in FIG. 6L, a top surface 181d of one of the phase shifters 18d is located at a different level than a top surface 141d of the pattern defining layer 14d. The top surface 181d of the phase shifter 18d may be lower than the top surface 141d of the pattern defining layer 14d. A height difference H1 of the top surface 181d of the phase shifter 18d and the top surface 141d of the pattern defining layer 14d may be in a range of about 3% to about 4% of the height of the phase shifter 18d. In the depicted embodiments, the height difference H1 of the top surface 181d of the phase shifter 18d and the top surface 141d of the pattern defining layer 14d is of about 2 nm. In some embodiments, two of the phase shifters 18d have different height relative to the top surface 141d of the pattern defining layer 14d, and thus different regions of the upper surface 105d of the reticle 10d have different variations in height.

FIGS. 7A through 7G show a series of schematic cross-sectional diagrams illustrating a method for forming a reticle 10e (FIG. 7F), in accordance with one embodiment of the present invention. Additional stages can be provided before, during, and after the method and some stages described can be replaced, eliminated, or moved around for additional embodiments. The method is an example, and is not intended to limit the present disclosure beyond what is explicitly recited in the claims.

Figure 7A:
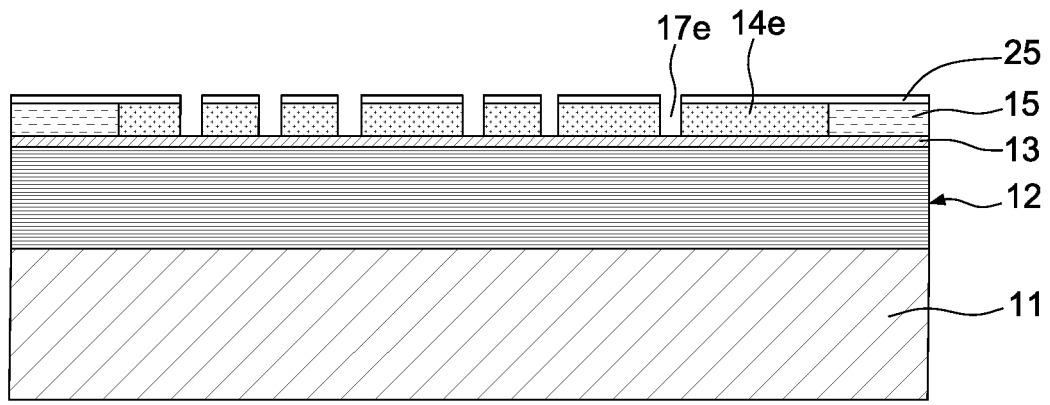
FIGS. 7A through 7F show various stages of a method of fabricating a reticle having a semi-dark pattern defining layer according to some embodiments of the disclosure.

Referring to FIG. 7A, the method for forming the reticle 10e includes providing a substrate 11 with a reflective structure 12, a capping layer 13, a pattern defining layer 14e, an absorber layer 15 and a buffer layer 25 formed thereon. The pattern defining layer 14e may be selected from molybdenum (Mo), niobium (Nb), palladium (Pd), ruthenium (Ru), or alloys such as Ni—Al. The absorber layer 15 is formed around the pattern defining layer 14e, and the pattern defining layer 14e and the buffer layer 25 are patterned. The methods for forming the absorber layer 15 and patterning the pattern defining layer 14e and the buffer layer 25 are similar to those stages illustrated in FIGS. 6A through 6F, and thus will not be repeated for the sake of brevity.

Figure 7B:
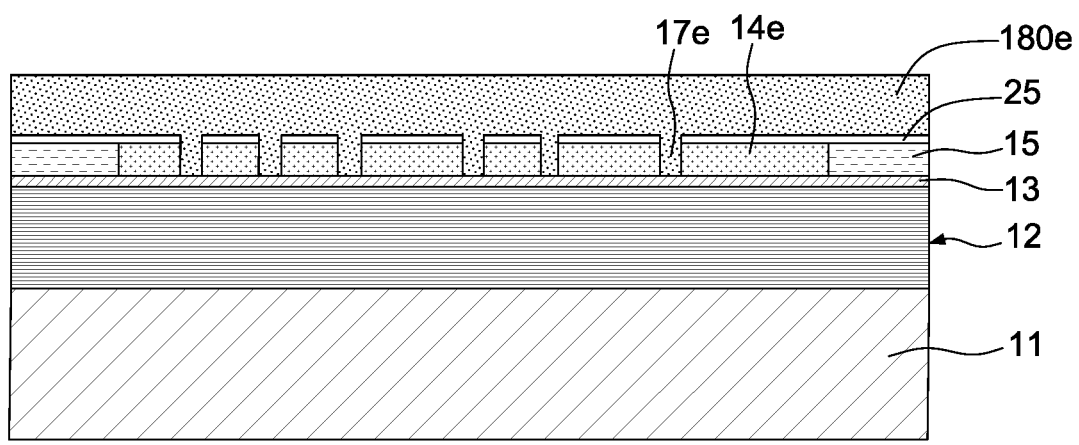

Referring to FIG. 7B, after the pattern defining layer 14e and the buffer layer 25 are patterned, the method for forming the reticle 10e includes forming a phase shifter material 180e over the buffer layer 25 by chemical vapor deposition (CVD), physical vapor deposition (PVD), atomic layer deposition (ALD), and/or another suitable process or processes. The phase shifter material 180e may include, for example, material selected from Zr, La, Si, C or B. After the formation of the phase shifter material 180e, the pattern trenches 17e in the pattern defining layer 14e are filled with the phase shifter material 180e.

Figure 7C:
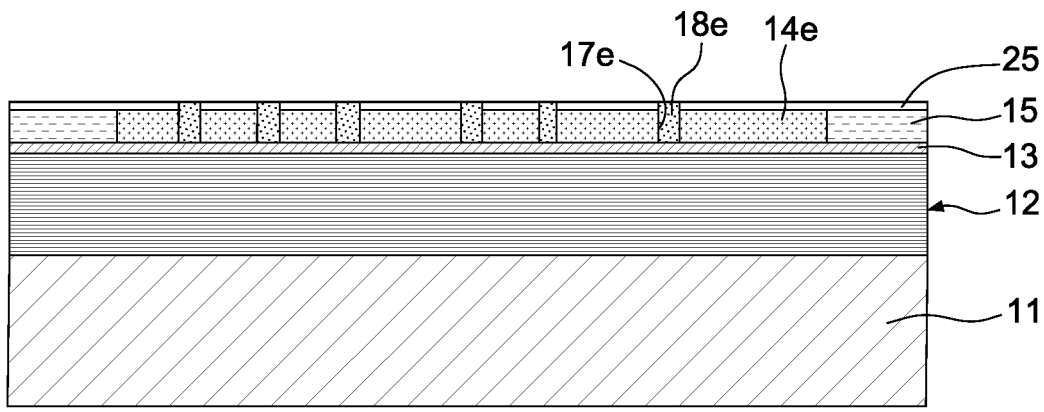
Figure 7D:
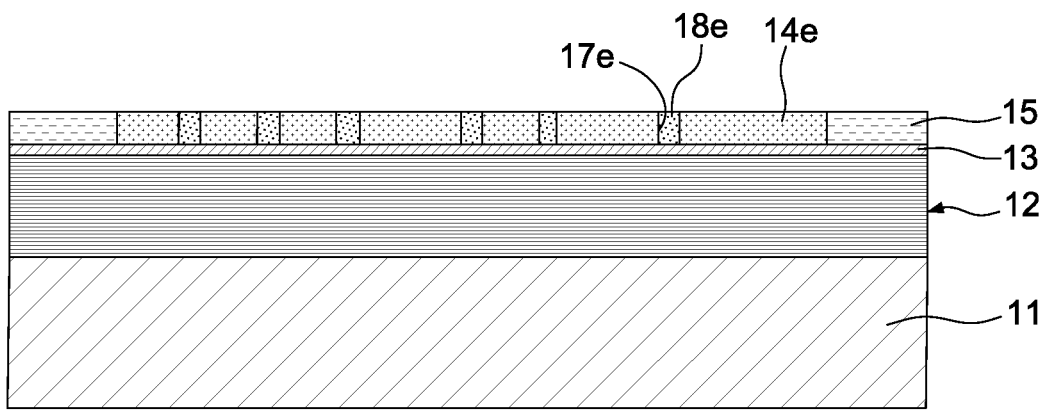

Afterwards, a removal process is performed to remove a portion of the phase shifter material 180e which is above the buffer layer 25 and the pattern trenches 17e to form a number of phase shifters 18e, such as Zr, La, Si, C, B or alloy thereof, in the pattern trenches 17e. In some embodiments, as shown in FIG. 7C, the removal process is conducted. The removal process may include an etching process, a CMP process or a combination of an etching process and a CMP process. In some embodiment, an etching process is performed first to remove a portion of the phase shifter material 180e to expose the buffer layer 25. During the etching process, the buffer layer 25 may act as a stop layer to stop the etching process thereon. Then, a CMP process is provided to remove the buffer layer 25 and the remaining phase shifter material 180e over the pattern trenches 17e to form the phase shifters 18e in the pattern trenches 17e, as shown in FIG. 7D. In some alternative embodiments, a CMP process is performed first until the buffer layer 25 is exposed, and then an etching process is applied to remove the buffer layer 25 and the phase shifter material 180e above the pattern defining layer 14e.

Figure 7E:
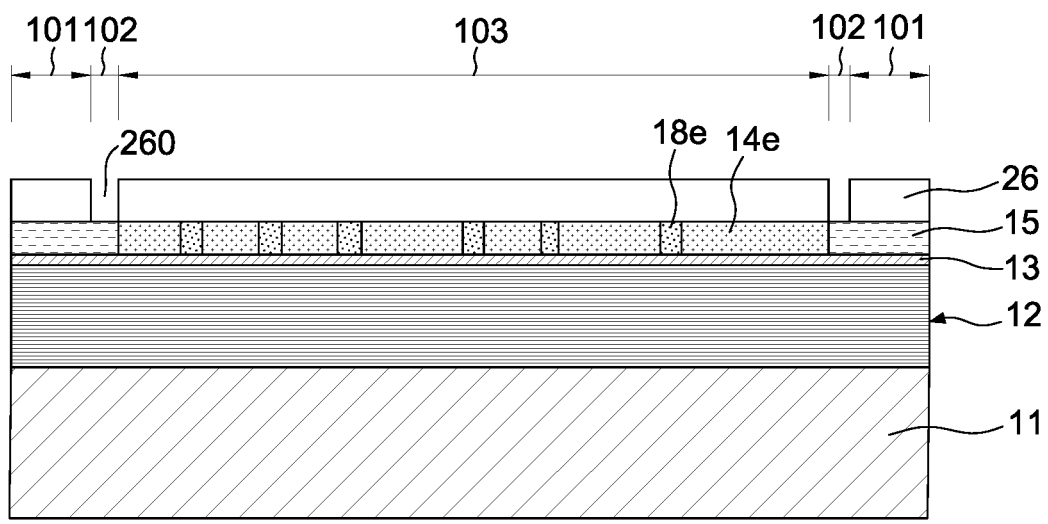

After the formation of the phase shifters 18e, the method for forming the reticle 10e further includes forming a frame trench 19 in a black border region 102 of the reticle 10e. The formation of the frame trench 19 may include forming a layer of photoresist 26 over the pattern defining layer 14e and the absorber layer 15 by a suitable process, such as spin-on coating, and then exposing and developing the layer of photoresist 26 to form photoresist feature 260, as shown in FIG. 7E. The photoresist feature 260 may have a ring shape to expose a top surface of the absorber layer 15 located in the black border region 102. Afterwards, an etching process is performed to transfer the patterns of the photoresist feature 260 to the underlying absorber layer 15.

Figure 7F:
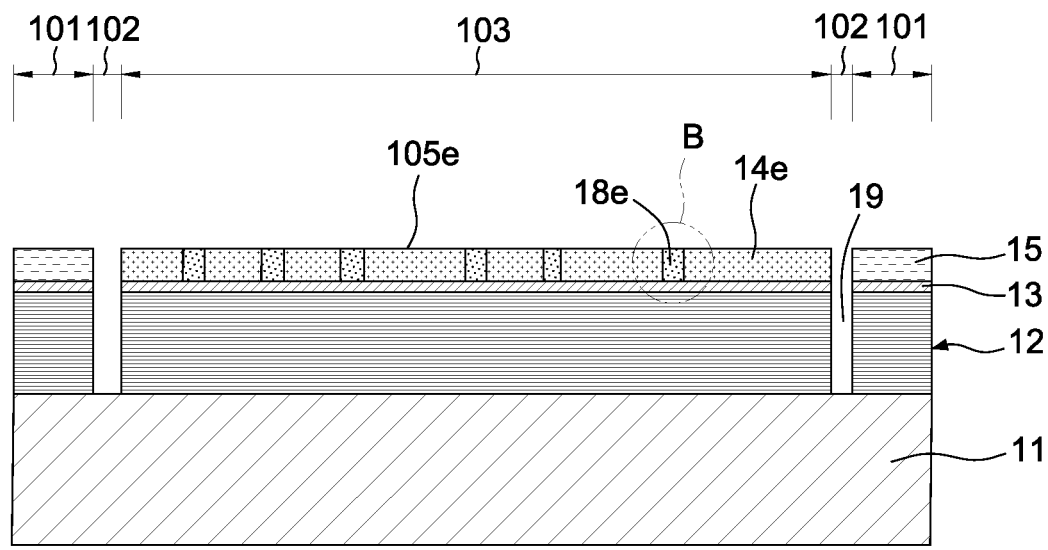

In the etching process, as shown in FIG. 7F, the absorber layer 15, the capping layer 13 and the reflective structure 12 uncovered by the photoresist 26 are removed to form the frame trench 19 therein. The layer of photoresist 26 may be removed after the etching process for forming the frame trench 19. In another embodiment, the reflective structure 12 is completely removed and stops on the surface of the substrate 11.

Figure 7G:
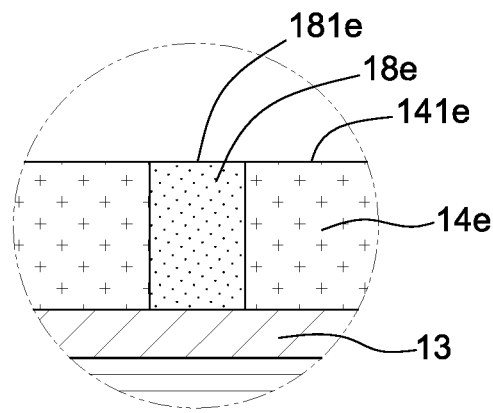
FIG. 7G shows a magnifying view of a region B in FIG. 7F.

In some embodiments, all of the openings or pattern trenches 17e in the pattern defining layer 14e are filled with the phase shifters 18e, and thus the entire upper surface 105e of the reticle 10e in the pattern region 103 is a flat surface. In some embodiments, as shown in FIG. 7G, a top surface 181e of one of the phase shifters 18e and a top surface 141e of the pattern defining layer 14e are located at the same level. That is, there is no height difference between the top surface 181e of the phase shifters 18e and the top surface 141e of the pattern defining layer 14e. In some alternative embodiments, a recess may be formed during the removal process of the phase shifter material 180e, and thus the top surface 181e of one of the phase shifters 18e may be lower than the top surface 141e of the pattern defining layer 14e. A height difference of the top surface 181e of the phase shifter 18e and the top surface 141e of the pattern defining layer 14e may be in a range of about 3% to about 4% of the height of the phase shifter 18e.

Figure 8A:
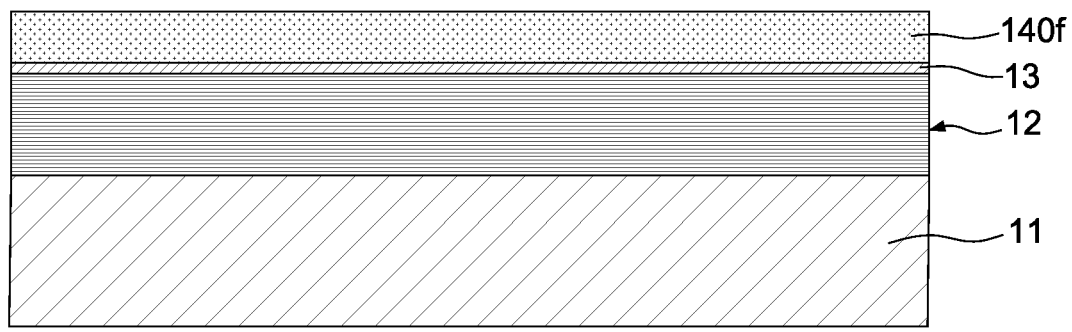
FIGS. 8A through 8F show various stages of a method of fabricating a reticle having a semi-dark pattern defining layer according to some embodiments of the disclosure.
Figure 8B:
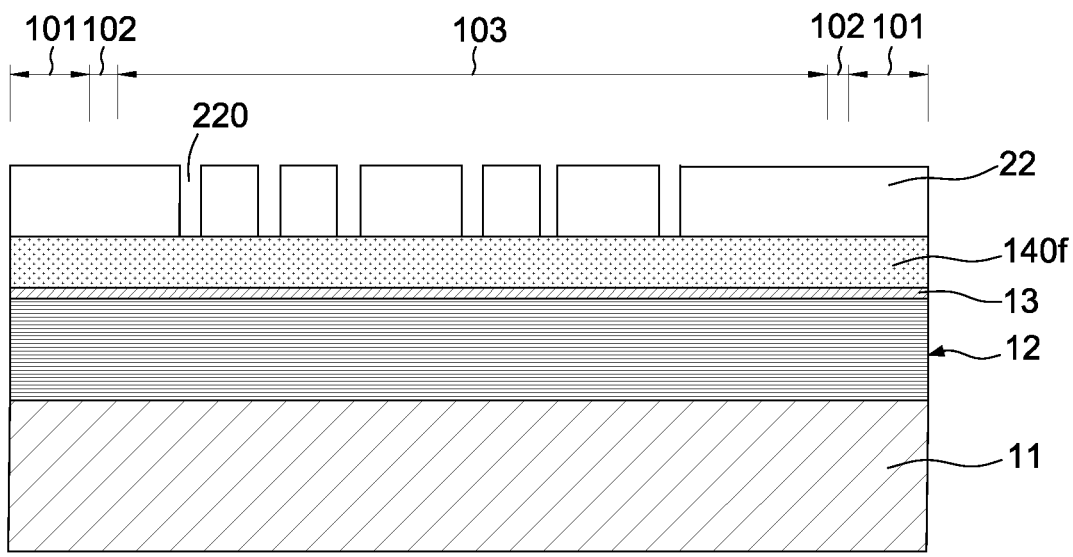
Figure 8C:
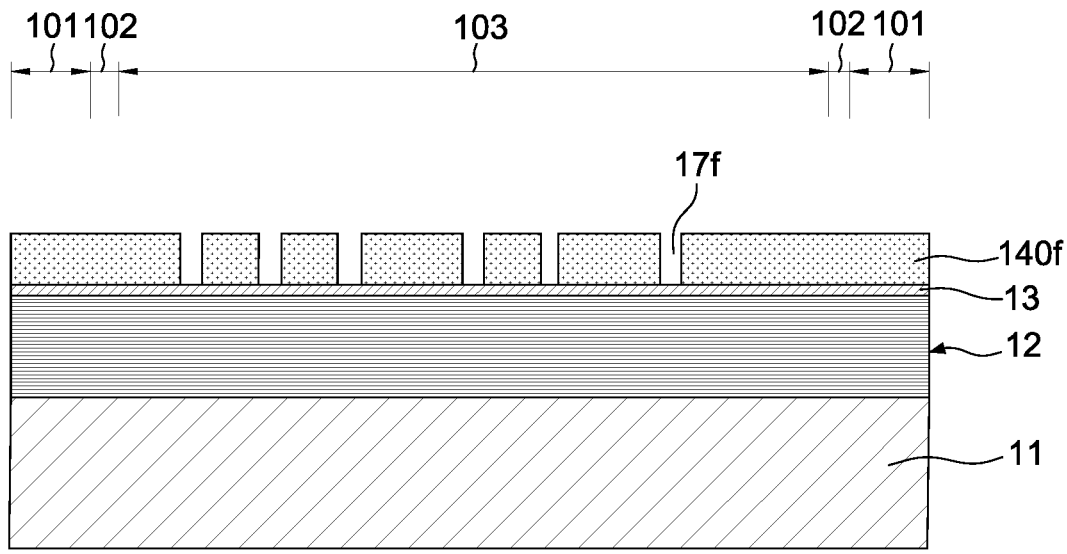
Figure 8D:
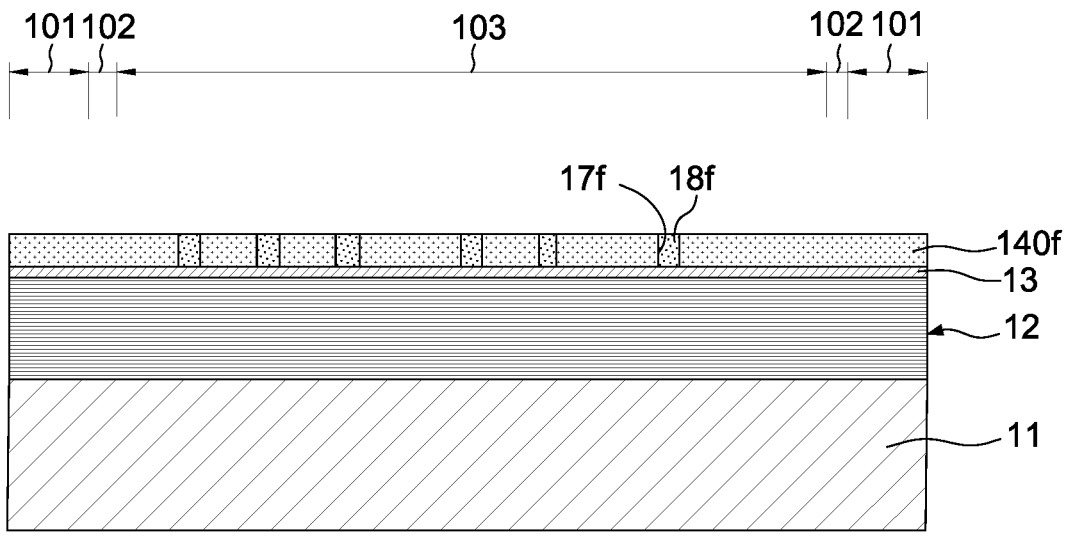
Figure 8E:
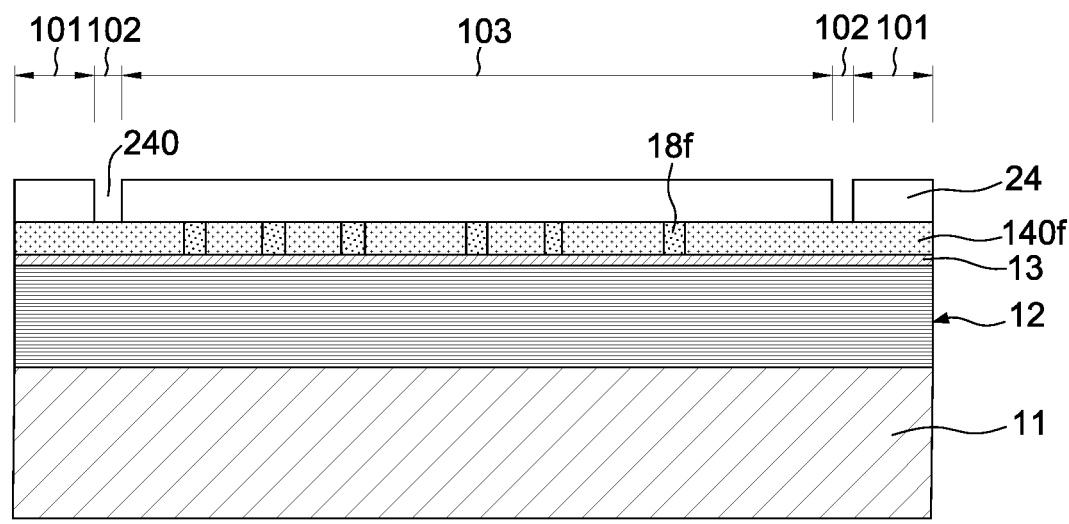
Figure 8F:
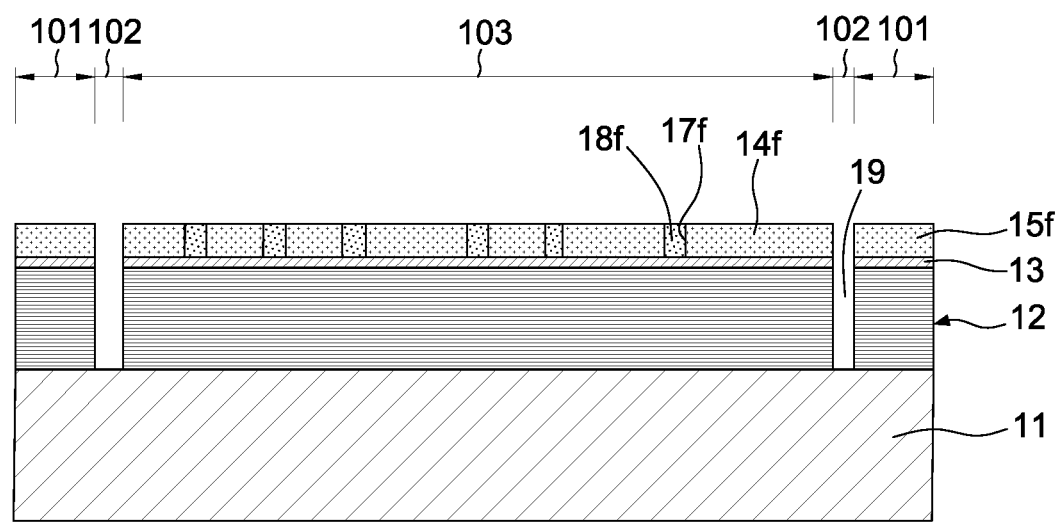

In some embodiments, as shown in FIG. 8F, an absorber layer 15f in a peripheral region 101 of a reticle 10f is made of same material with a pattern defining layer 14 in a pattern region 103 of the reticle 10f. FIGS. 8A through 8F show a series of schematic cross-sectional diagrams illustrating a method for forming the reticle 10f (FIG. 8F), in accordance with one embodiment of the present invention. Additional steps can be provided before, during, or after the method and some steps described can be replaced, eliminated, or moved around for additional embodiments. The method is an example, and is not intended to limit the present disclosure beyond what is explicitly recited in the claims.

Referring to FIG. 8A, the method for forming a reticle 10f includes forming a reflective structure 12, a capping layer 13 and a light translucent material 140f over a substrate 11 in sequence. The reflective structure 12, the capping layer 13 and the light translucent material 140f may be formed by chemical vapor deposition (CVD), physical vapor deposition (PVD), atomic layer deposition (ALD), and/or another suitable process or processes. In some embodiments, the reflective structure 12 is a multi-layer comprising alternating Mo and Si layers. The capping layer 13 includes ruthenium (Ru), RuSi, or a combination thereof and has a thickness ranging between about 2 nm and about 20 nm. The light translucent material 140f includes molybdenum (Mo) or niobium (Nb) and has a thickness ranging between about 40 nm and about 130 nm.

Referring to FIG. 8B, the method for forming the reticle 10f further includes patterning a portion of the light translucent material 140f which is located in the pattern region 103. The patterning process may include forming a layer of photoresist 22 over the light translucent material 140f by a suitable process, such as spin-on coating, and then exposing and developing the layer of photoresist 22 to form photoresist features 220. The photoresist feature 220 may be patterned according to a circuit pattern of a layer of an integrated circuit. In some embodiments, the photoresist feature 220 is patterned according to via holes or trench lines of an integrated circuit.

The method for forming the reticle 10f further includes performing an etching process to transfer the patterns of the photoresist features 220 to the underlying light translucent material 140f. In the etching process, the portion of the light translucent material 140f uncovered by the photoresist 22 is removed to form a number of pattern trenches 17f therein, as shown in FIG. 8C. The layer of photoresist 22 may be removed after the etching process of the light translucent material 140f.

After the formation of the pattern trenches 17f, the method for forming the reticle 10f further includes forming a number of phase shifters 18f in the pattern trenches 17d, as shown in FIG. 8D. The phase shifters 18f may be formed in the pattern trenches 17f by a self-assembled monolayers (SAM) process and an area selective deposition (ASD) process as those processes shown in FIGS. 6G through 6I. Alternatively, the phase shifters 18f may be formed in the pattern trenches 17f by depositing a phase shifter material over the pattern defining layer 14f and performing a removal process as those processes shown in FIGS. 7A through 7D.

After the formation of the phase shifters 18f, the method for forming the reticle 10f further includes forming a frame trench 19 in a black border region 102 of the reticle 10f. In some embodiments, as shown in FIG. 8E, the formation of the frame trench 19 may include forming a layer of photoresist 24 over the light translucent material 140f by a suitable process, such as spin-on coating, and then exposing and developing the layer of photoresist 24 to form photoresist feature 240. The photoresist feature 240 may have a rectangular shape to expose a top surface of the light translucent material 140f located in the black border region 102. Afterwards, an etching process is performed to transfer the patterns of the photoresist feature 240 to the underlying light translucent material 140f. In the etching process, the light translucent material 140f, the capping layer 13 and the reflective structure 12 uncovered by the photoresist 24 are removed to form the frame trench 19 therein, as shown in FIG. 8F. After formation of the frame trench 19, the light translucent material 140f in the black border region 102 refers to as absorber layer 15, and the light translucent material 140f in the peripheral region 101 refers to as pattern defining layer 14f. The layer of photoresist 24 may be removed after the etching process for forming the frame trench 19, and the process for forming the reticle 10f is completed.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respects, only illustrative. Changes may be made to details, particularly in matters of shape, size, and arrangement of parts without exceeding the scope of the disclosure. The scope of the disclosure is, of course, defined in the language in which the appended claims are expressed.

What is claimed is:

1. A reticle, comprising:
    a substrate;
    a reflective structure disposed over the substrate;
    a pattern defining layer, comprising a first material, deposited over the reflective structure, wherein the pattern defining layer comprises a pattern trench; and
    a phase shifter, comprising a second material, disposed in the pattern trench, wherein a transmittance of the second material is different from a transmittance of the first material, and wherein a ratio of the transmittance of the first material to a transmittance of the second material is in a range of about 0.62 to about 0.98.

2. The reticle of claim 1, wherein the transmittance of the first material and the transmittance of the second material are both greater than 50%.

3. The reticle of claim 1, wherein the first material and the second material are selected such that an exposure light transmitted from the phase shifter exhibits a lower intensity than that of the exposure light transmitted from the pattern defining layer.

4. The reticle of claim 1, wherein the first material comprises molybdenum (Mo) or niobium (Nb).

5. The reticle of claim 1, wherein the second material comprises lanthanum (La) or silicon (Si).

6. The reticle of claim 1, wherein an exposure light transmitted from the pattern defining layer and an exposure light transmitted from the phase shifter have a phase difference ranging from $\pi$ to $1.3\pi$.

7. The reticle of claim 1, wherein the pattern defining layer and the phase shifter collectively form an upper surface of the reticle for receiving an exposure light, and the upper surface is substantially a planar surface.

8. The reticle of claim 1, wherein a difference between a thickness of the pattern defining layer and a thickness of the phase shifter is less than 2 nm.

9. A reticle having a black border region and a pattern region surrounded by the black border region, comprising:
a substrate;
a reflective structure deposited over the substrate, wherein a frame trench is formed in the reflective structure relative to the black border region of the reticle;
a pattern defining layer deposited over the reflective structure relative to the pattern region of the reticle and having a pattern trench formed in the pattern defining layer;
an adsorber layer deposited adjacent the frame trench relative to a peripheral region of the reticle, wherein the adsorber layer has an absorbance that is greater than an absorbance of the pattern defining layer, and
a phase shifter deposited in the pattern trench, wherein an upper surface of the reticle relative to the pattern region, collectively defined by the pattern defining layer and the phase shifter, is a flat surface.

10. The reticle of claim 9, wherein:
the pattern defining layer comprises a first material; and
the phase shifter comprises a second material wherein a transmittance of the second material is different from a transmittance of the first material.

11. The reticle of claim 9, wherein a ratio of a transmittance of the pattern defining layer to a transmittance of the phase shifter is in a range of about 0.62 to about 0.98.

12. The reticle of claim 9, wherein a transmittance of the pattern defining layer and a transmittance of the phase shifter are both greater than 50%.

13. The reticle of claim 9, wherein an exposure light transmitted from the pattern defining layer and an exposure light transmitted from the phase shifter have a phase difference ranging from $\pi$ to $1.3\pi$.

14. The reticle of claim 9, wherein the pattern defining layer has a thickness of about 44 nm to about 53 nm.

15. A method for fabricating a reticle, comprising:
providing a substrate;
forming a reflective structure over the substrate;
depositing a pattern defining layer, comprising a first material, over the reflective structure forming a pattern trench in the pattern defining layer;
depositing a phase shifter, comprising a second material, in the pattern trench, wherein a transmittance of the second material is different from a transmittance of the first material, and wherein a ratio of the transmittance of the first material to a transmittance of the second material is in a range of about 0.62 to about 0.98.

16. The method of claim 15, wherein the transmittance of the first material and the transmittance of the second material are both greater than 50%.

17. The method of claim 15, wherein the first material comprises molybdenum (Mo) or niobium (Nb).

18. The method of claim 15, wherein the second material comprises lanthanum (La) or silicon (Si).

19. The method of claim 15, wherein a difference between a thickness of the pattern defining layer and a thickness of the phase shifter is less than 2 nm.

\* \* \* \* \*